US010971204B2

(12) United States Patent
Jiang et al.

(10) Patent No.: US 10,971,204 B2
(45) Date of Patent: Apr. 6, 2021

(54) THREE-DIMENSIONAL NON-VOLATILE FERROELECTRIC MEMORY

(71) Applicant: FUDAN UNIVERSITY, Shanghai (CN)

(72) Inventors: Anquan Jiang, Shanghai (CN); Xiaojie Chai, Shanghai (CN); Yan Zhang, Shanghai (CN)

(73) Assignee: FUDAN UNIVERSITY, Shanghai (CN)

(*) Notice: Subject to any disclaimer, the term of this patent is extended or adjusted under 35 U.S.C. 154(b) by 0 days.

(21) Appl. No.: 16/760,581

(22) PCT Filed: Dec. 10, 2018

(86) PCT No.: PCT/CN2018/119974
§ 371 (c)(1),
(2) Date: Apr. 30, 2020

(87) PCT Pub. No.: WO2020/056932
PCT Pub. Date: Mar. 26, 2020

(65) Prior Publication Data
US 2020/0279598 A1 Sep. 3, 2020

(30) Foreign Application Priority Data
Sep. 23, 2018 (CN) .......................... 201811111419.9

(51) Int. Cl.
*G11C 11/22* (2006.01)
*H01L 27/11585* (2017.01)

(52) U.S. Cl.
CPC ...... *G11C 11/2259* (2013.01); *G11C 11/2255* (2013.01); *G11C 11/2257* (2013.01); *H01L 27/11585* (2013.01)

(58) Field of Classification Search
None
See application file for complete search history.

(56) References Cited

U.S. PATENT DOCUMENTS 9,685,216 B2    6/2017  Jiang et al.
2004/0114416 A1 6/2004  Noh
(Continued)

FOREIGN PATENT DOCUMENTS

CN    1574356 A    2/2005
CN    1892897 A    1/2007
CN  108520879 A    9/2018

OTHER PUBLICATIONS

English translation of International Search Report for PCT/CN2018/119974 dated Jun. 28, 2019, 2 pages.
(Continued)

*Primary Examiner* — Douglas King
(74) *Attorney, Agent, or Firm* — Warner Norcross + Judd LLP

(57) ABSTRACT

Disclosed is a three-dimensional non-volatile ferroelectric memory including a ferroelectric memory array structure, wherein the ferroelectric memory array structure includes multiple layers of ferroelectric memory cell array disposed in a stacked way, and each layer of the ferroelectric memory cell array includes ferroelectric memory cells arranged in rows and columns; wherein word lines and bit lines which are substantially orthogonal to each other are oppositely disposed on two sides of the corresponding ferroelectric memory cell respectively, and a reference ferroelectric body is disposed adjacent to the corresponding ferroelectric memory cell. A polarization direction of an electric domain in the ferroelectric memory cell is not perpendicular to an electric field direction of a write voltage signal applied to the word line and the bit line; and when the write voltage signal is applied between the word line and the bit line.

14 Claims, 6 Drawing Sheets

(56) References Cited

U.S. PATENT DOCUMENTS

| | | |
|---|---|---|
| 2004/0245547 A1 | 12/2004 | Stipe |
| 2007/0002605 A1 | 1/2007 | Koide |
| 2015/0318285 A1* | 11/2015 | Zhang ............... H01L 27/10805 |
| | | 257/295 |
| 2016/0358639 A1 | 12/2016 | Jiang et al. |
| 2018/0005682 A1 | 1/2018 | Wang et al. |

OTHER PUBLICATIONS

Machine assisted English translation of CN108520879A obtained from https://patents.google/com/patent on Apr. 29, 2020, 12 pages.

* cited by examiner

THREE-DIMENSIONAL NON-VOLATILE FERROELECTRIC MEMORY

CROSS-REFERENCE TO RELATED APPLICATIONS

This is the National Stage of International Application No. PCT/CN2018/119974, filed on Dec. 10, 2018, which claims priority to Chinese patent application CN2018/11111419.9, filed on Sep. 23, 2018, the entireties of which are hereby incorporated by reference herein and forms a part of the specification.

FIELD OF THE INVENTION

The present invention pertains to a technical field of ferroelectric memory, and specifically to a three-dimensional non-volatile ferroelectric memory.

BACKGROUND

Conventional ferroelectric random access memory (FRAM) is a non-volatile memory which stores data by using two different polarization orientations of a ferroelectric domain (or referred to as "electric domain") in an electric field as logic information ("0" or "1"), and can be also referred to as "ferroelectric memory".

A ferroelectric memory device based on domain wall conduction has been proposed by Anquan JIANG et al. For example, in U.S. Pat. No. 9,685,216B2 and US Patent Publication No. US2016/0358639A1, a storage mechanism of such a ferroelectric memory has been described, which is clearly distinguished from that of the conventional ferroelectric memory, and with which non-destructive readout of data based on current reading can be realized. Currently, in the ferroelectric memory device based on the domain wall conduction storage mechanism, on one hand, an ON-state read current is large, and can reach up to $10^{-7}$A to $10^{-6}$A; and on the other hand, a ratio of the ON-state current to an OFF-state current (namely, an on-off ratio) may be greater than $10^6$, and the data retention performance is good. Therefore, the ferroelectric memory has received wide attention from the industry.

With the development of the applications of global Internet of Things, big data centers, smart homes, and portable devices, there are continuously increasing demands on the storage capacity and storage density of memory. For the conventional semiconductor memory chips, the storage capacity is increased by increasing the storage capability per unit area. However, in the Post-Moore era, bottlenecks such as the increased crosstalk between memory cells and the increased cost per word and bit become inevitable. Therefore, there is a need to seek breakthroughs and innovations in storage technology in terms of storage density, capacity, cost, and power consumption.

3D NAND is a revolutionary semiconductor storage technology, in which the storage density is increased by increasing stacked storage layers rather than reducing the two-dimensional size of devices, and the development space of the semiconductor memory is led into a third dimension, thus making the 3D NAND become a key to achieve a sustainable growth of the memory chip capacity in the future.

SUMMARY OF THE INVENTION

According to an aspect of the invention, a three-dimensional non-volatile ferroelectric memory is provided, which includes a ferroelectric memory array structure, wherein the ferroelectric memory array structure includes multiple layers of ferroelectric memory cell array disposed in a stacked way, and each layer of the ferroelectric memory cell array includes ferroelectric memory cells arranged in rows and columns; and wherein word lines and bit lines which are substantially orthogonal to each other are oppositely disposed on two sides of the corresponding ferroelectric memory cell respectively, and a reference ferroelectric body is disposed adjacent to the corresponding ferroelectric memory cell; and a polarization direction of an electric domain in the ferroelectric memory cell is not perpendicular to an electric field direction of a write voltage signal applied to the word line and the bit line; and when the write voltage signal is applied between the word line and the bit line, the electric domain in the ferroelectric memory cell can be reversed and a domain wall conductive passage can be established between the ferroelectric memory cell and the reference ferroelectric body adjacent thereto, wherein the word line and bit line on the two sides of the ferroelectric memory cell can be electrically connected by the domain wall conductive passage.

In a three-dimensional non-volatile ferroelectric memory according to an embodiment of the invention, the ferroelectric memory cell and the reference ferroelectric body are integrally formed by a same ferroelectric single crystal layer or ferroelectric thin film layer.

In a three-dimensional non-volatile ferroelectric memory according to another embodiment or any one of the preceding embodiments of the invention, each of the bit lines is shared by a plurality of ferroelectric memory cells of the multiple layers of ferroelectric memory cell array, which are correspondingly arranged in the stacking direction of the multiple layers of ferroelectric memory cell array; and each bit line of each layer of the ferroelectric memory cell array is shared by a plurality of ferroelectric memory cells of the ferroelectric memory cell array, which are correspondingly arranged in a column/row direction.

The three-dimensional non-volatile ferroelectric memory according to another embodiment or any one of the preceding embodiments of the invention further includes:

a bit element line layer disposed on a top layer and/or a bottom layer of the multiple layers of ferroelectric memory cell array, wherein each bit line of the bit element line layer is electrically connected to a plurality of the bit lines arranged sequentially in a row/column direction.

In a three-dimensional non-volatile ferroelectric memory according to another embodiment or any one of the preceding embodiments of the invention, the word line is coupled to two columns/rows of the ferroelectric memory cells respectively on two sides in the row/column direction, and is shared by the two columns/rows of the ferroelectric memory cells; and/or the bit line is coupled to two inline ferroelectric memory cells correspondingly arranged in the stacking direction on two sides in the row/column direction and is shared by the two inline ferroelectric memory cells.

In a three-dimensional non-volatile ferroelectric memory according to another embodiment or any one of the preceding embodiments of the invention, the ferroelectric memory cell of the multiple layers of ferroelectric memory cell array and the corresponding reference ferroelectric body are integrally formed by a same ferroelectric single crystal layer or ferroelectric thin film layer.

In a three-dimensional non-volatile ferroelectric memory according to another embodiment or any one of the preceding embodiments of the invention, the ferroelectric single crystal layer or the ferroelectric thin film layer is patterned to have first deep trenches and second deep trenches both extending in the stacking direction, wherein the bit lines are formed in the first deep trenches, a plurality of the word lines are formed in a same second deep trench, and the corresponding word lines are isolated via dielectric layers in the second deep trenches; and wherein the ferroelectric memory cell of the multiple layers of ferroelectric memory cell array and the corresponding reference ferroelectric body are formed in a ferroelectric body between the first deep trench and the second deep trench, a portion of the ferroelectric body adjacent to the dielectric layer in the second deep trench is the reference ferroelectric body, and a portion of the ferroelectric body adjacent to the word line in the second deep trench is the ferroelectric memory cell.

In a three-dimensional non-volatile ferroelectric memory according to another embodiment or any one of the preceding embodiments of the invention, a plurality of the word lines and a plurality of dielectric layers in the same second deep trench are arranged alternately in the stacking direction, and a plurality of the reference ferroelectric bodies and a plurality of the ferroelectric memory cells are arranged alternately in the stacking direction.

In a three-dimensional non-volatile ferroelectric memory according to another embodiment or any one of the preceding embodiments of the invention, each layer of the ferroelectric memory cell array includes:

a ferroelectric substrate layer as the reference ferroelectric body;

a plurality of ferroelectric memory cells arranged in rows and columns and protruded with respect to the ferroelectric substrate layer; and a word line layer including a plurality of word lines, which is disposed on the ferroelectric substrate layer;

wherein the bit lines extend through the ferroelectric substrate layers of the multiple layers of ferroelectric memory cell array in the stacking direction.

In a three-dimensional non-volatile ferroelectric memory according to another embodiment or any one of the preceding embodiments of the invention, each layer of the ferroelectric memory cell array includes:

a bit line layer/word line layer for forming a plurality of bit lines/word lines;

a ferroelectric body layer on the bit line layer; and a word line layer/bit line layer for forming a plurality of word lines/bit lines and located on the ferroelectric body layer;

wherein a ferroelectric body layer corresponding to an intersection of the word line and the bit line is configured to form the ferroelectric memory cell, and the remaining portion of the ferroelectric body layer is configured to form the reference ferroelectric body.

In a three-dimensional non-volatile ferroelectric memory according to another embodiment or any one of the preceding embodiments of the invention, each of the ferroelectric memory cells has a unidirectional conduction characteristic in an ON state.

In a three-dimensional non-volatile ferroelectric memory according to another embodiment or any one of the preceding embodiments of the invention, the three-dimensional non-volatile ferroelectric memory has a read voltage greater than a turn-on voltage for causing the ferroelectric memory cell to conduct unidirectionally and less than a coercive voltage of the ferroelectric memory cell.

In a three-dimensional non-volatile ferroelectric memory according to another embodiment or any one of the preceding embodiments of the invention, a ferroelectric material used for the ferroelectric single crystal layer or the ferroelectric thin film layer is selected from one or more of the followings:

lithium tantalate $LiTaO_3$, lithium niobate $LiNbO_3$ or Bismuth ferrite $BiFeO_3$;

lithium tantalate $LiTaO_3$, lithium niobate $LiNbO_3$ or Bismuth ferrite $BiFeO_3$ doped with a material selected from MgO, $Mn_2O_5$, $Fe_2O_3$ or $La_2O_3$;

lead zirconate titanate $(Pb, Zr)TiO_3$ or $BaTiO_3$; and blackened lithium tantalate $LiTaO_3$ or blackened lithium niobate $LiNbO_3$.

In a three-dimensional non-volatile ferroelectric memory according to another embodiment or any one of the preceding embodiments of the invention, there is an included angle between the polarization direction of the electric domain of the ferroelectric memory cell and a direction of a connecting line between the word line and the bit line on two sides of the ferroelectric memory cell, and the electric domain has a component in the direction of the connecting line.

BRIEF DESCRIPTION OF THE DRAWINGS

The above and other objectives and advantages of the invention will become thoroughly clear from the following detailed description in connection with the accompanying drawings, wherein identical or similar elements are denoted by identical reference numerals.

DETAILED DESCRIPTION OF THE INVENTION

Figure 1:
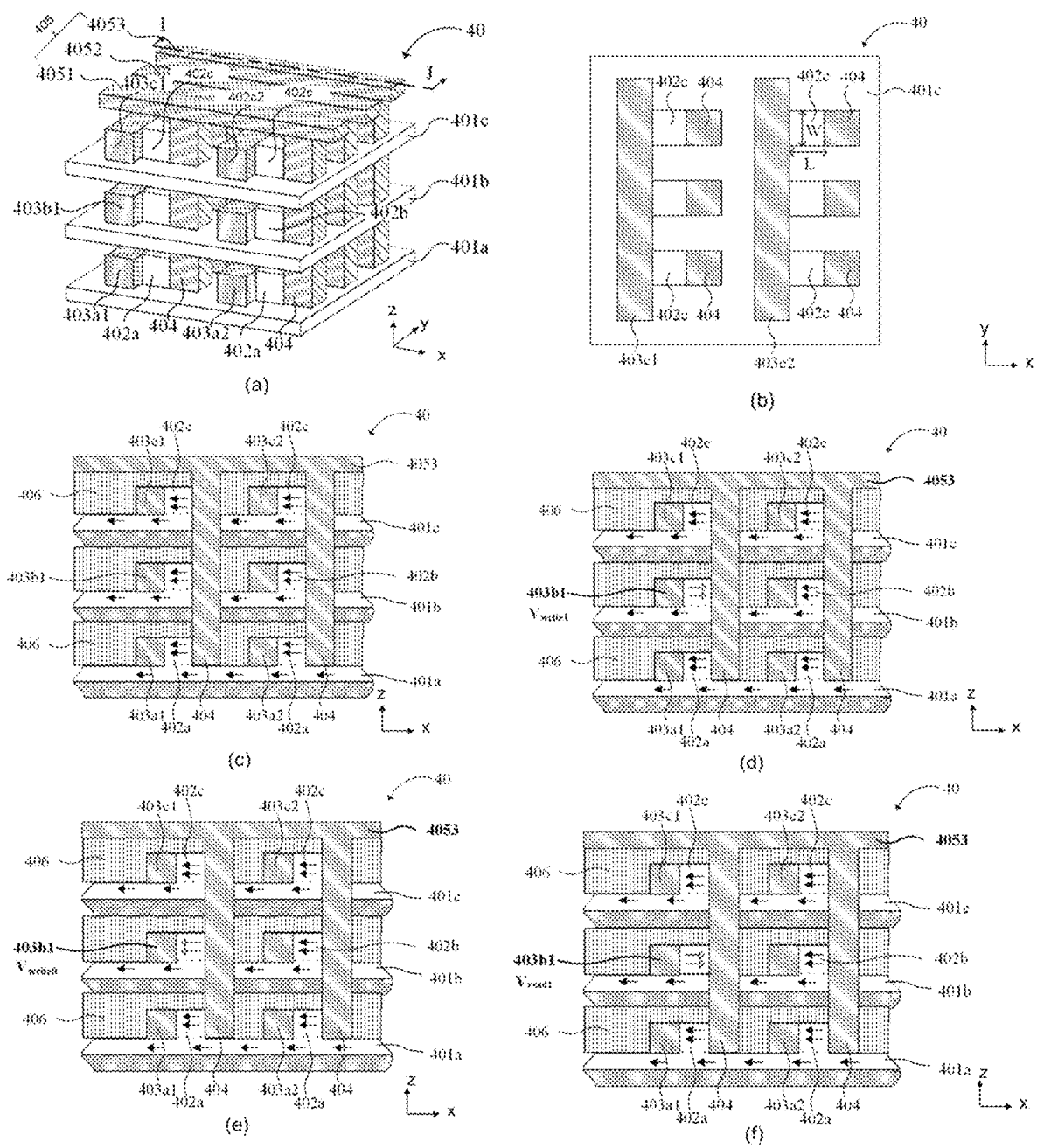
FIG. 1 is a schematic view of a ferroelectric memory array structure of a three-dimensional non-volatile ferroelectric memory according to a first embodiment of the invention and its operational principle.

Hereinafter, some of many possible embodiments of the invention will be described in order to provide a basic understanding of the invention and not to identify crucial or decisive elements of the invention or define the scope of protection.

In the drawings, the thicknesses of layers and areas have been exaggerated for clarity. The dimensional scaling relationship among the portions shown in the drawings does not reflect an actual dimensional scaling relationship.

In the following embodiments, an electric domain direction or polarization direction is illustratively given for the purpose of a clear description. However, it is to be understood that the electric domain direction or polarization direction of ferroelectric memory is not limited to the direction shown in the embodiments in the drawings.

Herein, the ferroelectric single crystal refers to a single crystal structure or a single crystal-like structure in which a "grain boundary" of a polycrystalline structure does not internally exist; the memory cell of the memory cell array formed on the ferroelectric single crystal also has a single crystal structure, and the size of the memory cell is not limited. The ferroelectric single crystal may be a ferroelectric single crystal thin film layer or a ferroelectric single crystal substrate, and the ferroelectric single crystal thin film layer may be a single crystal thin film formed by epitaxial growth of single crystal, or a thin film layer formed by cutting or separating the ferroelectric single crystal substrate.

In the following embodiments, the non-volatile ferroelectric memory includes a ferroelectric memory array, and a plurality of ferroelectric memory cells in the ferroelectric memory array are arranged in rows and columns. In this way, the ferroelectric memory cells in the corresponding column and the corresponding row may be selected by means of a read/write circuit for performing a corresponding write or read operation. It is noted that the specific number and arrangement of the ferroelectric memory cells in the ferroelectric memory array are not limited.

FIG. 1 is a schematic view of a ferroelectric memory array structure of a three-dimensional non-volatile ferroelectric memory according to a first embodiment of the invention and its operational principle. For clarity and convenience of explanation, FIG. 1(a) illustrates a three-dimensional schematic structural view of a ferroelectric memory array structure 40 according to the embodiment, FIG. 1(b) is a top view of the ferroelectric memory array structure 40 without a top bit element line layer, FIG. 1(c) is a cross-sectional view taken along line I-J in FIG. 1(a), FIG. 1(d) schematically illustrates a principle of an operation of writing data "1" into a ferroelectric memory cell of the ferroelectric memory array structure 40, FIG. 1(e) schematically illustrates a principle of an operation of writing data "0" into a ferroelectric memory cell of the ferroelectric memory array structure 40, and FIG. 1(f) schematically illustrates a principle of an operation of reading data "1" from a ferroelectric memory cell of the ferroelectric memory array structure 40. For convenience of illustration, in the ferroelectric memory array structures illustrated in FIGS. 1-5, the z direction is defined as the stacking direction of multiple layers of the ferroelectric memory cell array, which is generally perpendicular to the substrate, the x direction is defined as the direction of the row in which each layer of the ferroelectric memory cell array is located, and the y direction is defined as the direction of the column in which each layer of the ferroelectric memory cell array is located.

As shown in FIG. 1, the ferroelectric memory array structure 40 is included in a three-dimensional non-volatile ferroelectric memory, a corresponding peripheral read/write circuit may be configured for it, and the specific structure of the peripheral read/write circuit is not limited. In order to clearly describe the present invention, a description of the peripheral read/write circuit is omitted herein.

The ferroelectric memory array structure 40 may include a plurality of ferroelectric substrate layers 401 (for example, ferroelectric substrate layers 401a, 401b, and 401c stacked sequentially from bottom to top), multiple layers of memory cell array 402 (for example, memory cell arrays 402a, 402b, and 402c stacked sequentially from bottom to top), a plurality of word line layers 403 (for example, word line layers 403a, 403b, and 403c stacked sequentially from bottom to top), a bit line array 404, a top bit element line layer 405 and a plurality of insulating layers 406. The uppermost insulating layer 406 may isolate the top bit element line layer 405 from the ferroelectric substrate layer 401 and the like, and the intermediate insulating layer 406 may isolate the plurality of word line layers 403 from each other; other voids may be filled by insulating material.

In this way, the ferroelectric memory array structure 40 includes multiple layers of ferroelectric memory cell array disposed in a stacked way, which are sequentially stacked in the z direction, that is, the stacking direction of them is the z direction. Each layer of the ferroelectric memory cell array includes a ferroelectric substrate layer 401, a memory cell array 402 disposed on the ferroelectric substrate layer 401, and a word line layer 403 disposed on the ferroelectric substrate layer 401. Each word line of the word line layer 403 extends in the y direction, and a plurality of word lines are sequentially arranged in parallel in the x direction. For example, word lines 403a1 and 403a2 of a word line layer 403a are arranged in parallel, word lines 403b1 and 403b2 of a word line layer 403b are arranged in parallel, and word lines 403c1 and 403c2 of a word line layer 403c are arranged in parallel. The plurality of ferroelectric memory cells of each layer of the memory cell array 402 (for example, the memory cell array 402a, the memory cell array 402b or the memory cell array 402c) are arranged in the row and column directions, for example, the ferroelectric memory cells are arranged in lattices in the x-direction and the y-direction, and each ferroelectric substrate layer 401 is arranged in the xy plane. Specifically, the plurality of ferroelectric memory cells of the memory cell array 402 on each ferroelectric substrate layer 401 may be arranged in the form of a bump with respect to the ferroelectric substrate layer 401. For example, the plurality of ferroelectric memory cells are convexly disposed with respect to the ferroelectric substrate layer 401, and the sizes of each ferroelectric memory cell (for example, the specific size L in the x direction, and the specific size W in the y direction) are not limited.

Still referring to FIG. 1, the top bit element line layer 405 is disposed at the top, for example, disposed above the word line layer 403c, and the bit line array 404 is disposed to be substantially perpendicular to the plurality of ferroelectric substrate layers 401 and electrically connected to the top bit element line layer 405. The bit element lines of the top bit element line layer 405 may extend in the x direction, and a plurality of bit element lines may be sequentially arranged substantially in parallel in the y direction. The bit lines may be coupled to the read/write circuit external to the ferroelectric memory array structure 40 via the bit element lines of the top bit element line layer 405.

Still referring to FIG. 1, each bit line of the bit line array 404 extends in the z direction (for example, extends downward from a position where it connects with the top bit element line layer 405), and is spatially orthogonal to a plurality of word lines of different word line layers. In this way, each of the bit lines may be shared by a plurality of ferroelectric memory cells of the multiple layers of ferroelectric memory cell array which are correspondingly arranged in the stacking direction of the multiple layers of ferroelectric memory cell array. A word line of the word line layer 403 and a bit line of the bit line array 404 are adjacent to two sides of each ferroelectric memory cell in the x-direction respectively, that is, each ferroelectric memory cell is disposed at the orthogonal position of the word line and bit line, whereby a Crossbar structure in an example of the invention is formed.

It is noted that the ferroelectric substrate layer 401 and the plurality of ferroelectric memory cells thereon may be formed by patterning a ferroelectric single crystal layer or a ferroelectric thin film material layer by using a method such as etching. The ferroelectric substrate layer 401 may be used to form the reference ferroelectric bodies (for example, also referred to as "reference cells") of the ferroelectric memory cells, which are adjacent to each of the ferroelectric memory cells, and domain wall conductive passages may be established at their approximate adjacent positions.

The initial polarization direction of the electric domain of each ferroelectric memory cell may be defined to have a component in the x direction. It may also be understood that the initial polarization direction of the electric domain of the memory cell is at an angle to the ferroelectric substrate layer 401 and has a component on the ferroelectric substrate layer 401, but must not be perpendicular to the ferroelectric substrate layer 401 (for example, not in the z direction). In this way, the polarization direction of the electric domain of the ferroelectric memory cell is not perpendicular to the direction of the electric field of the write voltage signal applied to the word lines and bit lines on two sides of the ferroelectric memory cell. As shown in FIG. 1(c), the solid-line arrows indicate the initial polarization directions of the electric domains in the ferroelectric memory cells and the ferroelectric substrate layers 401, which may for example be parallel to the x direction. It is understood that the initial polarization directions of the electric domains of each ferroelectric memory cell and its corresponding reference ferroelectric body (for example, ferroelectric substrate layer 401) are not limited to the direction shown in FIG. 1; for example, it may also be a direction which is at an angle but not perpendicular to the x direction, so that there is a component in the x direction.

It is noted that the initial polarization direction of the electric domain of each ferroelectric memory cell having a component in the x direction may also be understood as the initial polarization direction having a projection in the x direction.

As shown in FIG. 1(a), the word line layer 403 may include, but be not limited to, three levels, which are sequentially formed on the ferroelectric substrate layer 401. The word lines at each level include a plurality of word lines substantially parallel to each other and extending in the y direction, and are sequentially filled in gaps between adjacent columns of ferroelectric memory cells in the x direction. The word line layer 403 may be vertically aligned in the z direction, that is, the word lines in each of the plurality of levels may be positioned at the same position of each level so that the word lines of different layers are aligned in the z direction.

Still referring to FIG. 1, each ferroelectric memory cell of the memory cell array 402 has a unidirectional conduction characteristic in an ON state, and therefore, the ferroelectric memory cell behaves as having a switch characteristic and has a relatively measurable turn-on voltage $V_{on}$ when a current is read out in the ON state. For the ferroelectric memory cell selected by the word line 403b1 and the bit element line 4053 as shown in FIG. 1(f), the polarization direction of the electric domain of the ferroelectric memory cell is opposite to the polarization direction of the adjacent reference ferroelectric body below it, and a conductive domain wall is easily formed at their interface, that is, a domain wall conductive passage is established. In a case that the voltage applied to the ferroelectric memory cell is less than the coercive voltage $V_c$ and greater than the turn-on voltage $V_{on}$, if there is a large on-state current flowing through, the stored data may be read out as "1", otherwise, the stored data may be read out as "0".

The principle of the read/write operation of the three-dimensional non-volatile ferroelectric memory according to an embodiment of the present invention is further described with reference to FIG. 1(d) to FIG. 1(f) below.

As shown in FIG. 1(d), it is assumed that a certain ferroelectric memory cell of the ferroelectric memory array structure 40 is selected for the operation of writing data "1". For example, the word line 403b1 and the bit element line 4053 are selected. The word line 403b1 is configured at a high voltage $V_{write1}$, the value of which is greater than the coercive voltage $V_c$ of the ferroelectric memory cell, and other word lines are floating or configured at a half-height level $V_c/2$; meanwhile, the bit element line 4053 is configured to be grounded, and other bit element lines are floating or configured at a half-height level $V_c/2$. In this way, an electric field having a direction opposite to the initial polarization direction of the ferroelectric memory cell is applied to the selected ferroelectric memory cell, the electric domain of the ferroelectric memory cell is reversed in the positive direction of the x direction, data "1" is written, and the direction indicated by the hollow arrows is the polarization direction of the electric domain after being reversed. After the operation of writing data "1" is completed, the word line 403b1 and the bit element line 4053 may be floating or configured at a half-height level $V_c/2$.

As shown in FIG. 1(e), it is assumed that a certain ferroelectric memory cell of the ferroelectric memory array structure 40 is still selected for the operation of writing data "0". For example, the word line 403b1 and the bit element line 4053 are selected. The word line 403b1 is configured to be grounded, other word lines are floating or configured at a half-height level $V_c/2$, and the top bit element line 4053 is configured at a high voltage $V_{write0}$, the value of which is greater than the coercive voltage $V_c$ of the ferroelectric memory cell. In this way, an electric field having a direction which is the same as the initial polarization direction of the ferroelectric memory cell is applied to the selected ferroelectric memory cell, the electric domain of the ferroelectric memory cell is reversed in the negative direction of the x direction, data "0" is written, and the direction indicated by the hollow arrows is the polarization direction of the electric domain after being reversed. After the operation of writing data "0" is completed, the word line 403b1 and the bit element line 4053 may be floating or configured at a half-height level $V_c/2$.

As shown in FIG. 1(f), it is assumed that a certain ferroelectric memory cell of the ferroelectric memory array structure 40 is still selected for a read operation (for example, a read operation of reading data "1"). For example, the word line 403b1 and the bit element line 4053 are selected. The word line 403b1 is configured at a voltage $V_{read1}$, the value of which is greater than the turn-on voltage $V_{on}$ and less than the coercive voltage $V_c$ of the ferroelectric memory cell, and other word lines are floating or configured at a half-height level $V_c/2$; meanwhile, the bit element line 4053 is configured to be grounded, and other bit element lines are floating or configured at a half-height level $V_c/2$. Since there is a domain wall conductive passage (as indicated by the black solid line in FIG. 1(f)) between the selected ferroelectric memory cell and the reference ferroelectric body (for example, the ferroelectric substrate layer 401b), there is a large on-state current (which may for example reach up to $10^{-7}$A to $10^{-6}$A), so that the data stored in the selected ferroelectric memory cell may be read out as "1". After the reading is completed, the word line 403b1 and the bit element line 4053 may be floating or configured at a half-height level $V_c/2$. Similarly, the data status corresponding to the disappearance of the domain wall may be read out, for example, data "0". At this point, a very small off-state current is read out, that is, the stored data "0" is read out. It is noted that the read voltage $V_{read}$ selected in the process of reading information is adjustable.

Figure 2:
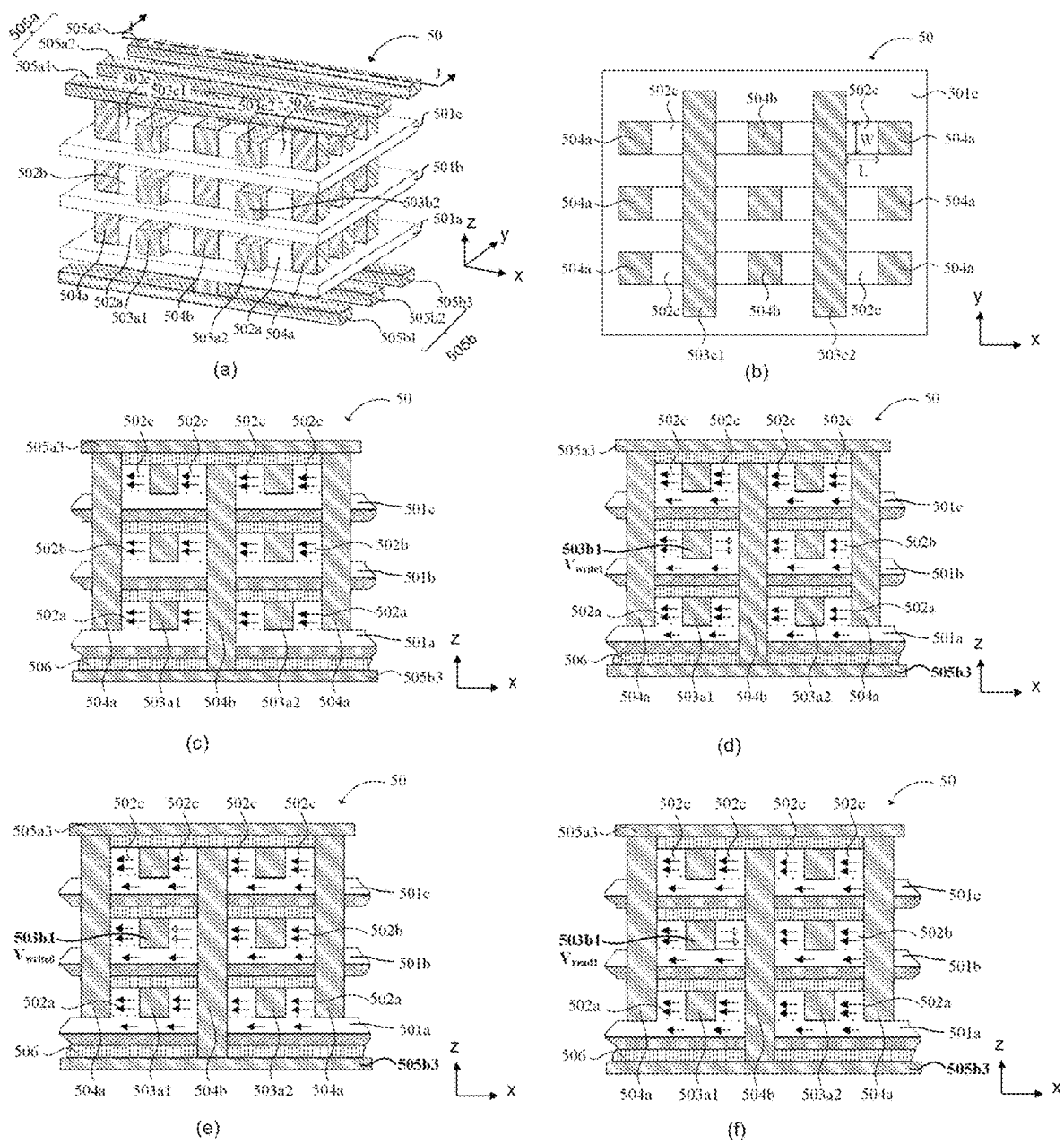
FIG. 2 is a schematic view of a ferroelectric memory array structure of a three-dimensional non-volatile ferroelectric memory according to a second embodiment of the invention and its operational principle.

FIG. 2 is a schematic view of a ferroelectric memory array structure of a three-dimensional non-volatile ferroelectric memory according to a second embodiment of the invention and its operational principle. For clarity and convenience of explanation, FIG. 2(a) illustrates a three-dimensional schematic structural view of a ferroelectric memory array structure 50 according to the embodiment, FIG. 2(b) is a top view of the ferroelectric memory array structure 50 without a top bit element line layer, FIG. 2(c) is a cross-sectional view taken along line I-J in FIG. 2(a), FIG. 2(d) schematically illustrates a principle of an operation of writing data "1" into a ferroelectric memory cell of the ferroelectric memory array structure 50, FIG. 2(e) schematically illustrates a principle of an operation of writing data "0" into a ferroelectric memory cell of the ferroelectric memory array structure 50, and FIG. 2(f) schematically illustrates a principle of an operation of reading data "1" from a ferroelectric memory cell of the ferroelectric memory array structure 50.

As shown in FIG. 2, the ferroelectric memory array structure 50 is included in a three-dimensional non-volatile ferroelectric memory, a corresponding peripheral read/write circuit may be configured for it, and the specific structure of the peripheral read/write circuit is not limited. In order to clearly describe the present invention, a description of the peripheral read/write circuit is omitted herein.

The ferroelectric memory array structure 50 may include a plurality of ferroelectric substrate layers 501 (for example, ferroelectric substrate layers 501a, 501b, and 501c stacked sequentially from bottom to top), multiple layers of memory cell array 502 (for example, memory cell arrays 502a, 502b, and 502c stacked sequentially from bottom to top), a plurality of word line layers 503 (for example, word line layers 503a, 503b, and 503c stacked sequentially from bottom to top), bit line arrays 504 (for example, bit line arrays 504a and 504b), a top bit element line layer 505a, a bottom bit element line layer 505b and a plurality of insulating layers 506. The uppermost insulating layer 506 may isolate the top bit element line layer 505 from the ferroelectric substrate layer 501 and the like, and the intermediate insulating layer 506 (for example, a dielectric layer in the second deep trench) may isolate the plurality of word line layers 503 from each other; other voids may be filled by insulating material.

In this way, the ferroelectric memory array structure 50 includes multiple layers of ferroelectric memory cell array disposed in a stacked way, which are sequentially stacked in the z direction, that is, the stacking direction of them is the z direction. Each layer of the ferroelectric memory cell array includes a ferroelectric substrate layer 501, a memory cell array 502 disposed on the ferroelectric substrate layer 501, and a word line layer 503 disposed on the ferroelectric substrate layer 501. Each word line of the word line layer 503 extends in the y direction, and a plurality of word lines are sequentially arranged in parallel in the x direction. For example, word lines 503a1 and 503a2 of a word line layer 503a are arranged in parallel, word lines 503b1 and 503b2 of a word line layer 503b are arranged in parallel, and word lines 503c1 and 503c2 of a word line layer 503c are arranged in parallel. The plurality of ferroelectric memory cells of each layer of the memory cell array 502 (for example, the memory cell array 502a, the memory cell array 502b or the memory cell array 502c) are arranged in the row and column directions, for example, the ferroelectric memory cells are arranged in lattices in the x-direction and the y-direction, and each ferroelectric substrate layer 501 is arranged in the xy plane. Specifically, the plurality of ferroelectric memory cells of the memory cell array 502 on each ferroelectric substrate layer 501 may be arranged in the form of a bump with respect to the ferroelectric substrate layer 501. For example, the plurality of ferroelectric memory cells are convexly disposed with respect to the ferroelectric substrate layer 501. Compared with the arrangement of word lines and ferroelectric memory cells shown in FIG. 1, the intermediate word lines of the word line array of the word line layer 503 are arranged between two ferroelectric memory cells in FIG. 2. In this way, the word lines are coupled to two columns of ferroelectric memory cells on two sides in the x direction respectively and shared by the two columns of ferroelectric memory cells. Therefore, compared with the embodiment shown in FIG. 1, word lines can be reduced and the storage density can be further improved for the ferroelectric memory array structure 50 of the three-dimensional non-volatile ferroelectric memory according to the embodiment shown in FIG. 2.

Still referring to FIG. 2, the top bit element line layer 505a is disposed at the top, for example, disposed above the word line layer 503c, and the bit line array 504a is disposed to be substantially perpendicular to the plurality of ferroelectric substrate layers 501 and electrically connected to the top bit element line layer 505a. The bottom bit element line layer 505b is disposed at the bottom, for example, disposed below the bottom layer of ferroelectric memory cell array (for example, disposed below the ferroelectric substrate layer 501a), and the bit line array 504b is disposed substantially to be perpendicular to the plurality of ferroelectric substrate layers 501 and electrically connected to the bottom bit element line layer 505b. The bit element lines of the top bit element line layer 505a and the bottom bit element line layer 505b may extend in the x direction, and the plurality of bit element lines may be sequentially arranged substantially in parallel in the y direction. The bit lines may be coupled to the read/write circuit external to the ferroelectric memory array structure 50 via the bit element lines of the top bit element line layer 505a or the bottom bit element line layer 505b.

Still referring to FIG. 2, the bit line array 504 includes a bit line array 504a and a bit line array 504b, each bit line of the bit line array 504 extends in the z direction. Each bit line of the bit line array 504a extends downward from a position where it connects with the top bit element line layer 505a, and each bit line of the bit line array 504b extends downward from a position where it connects with the bottom bit element line layer 505b. Each of the bit lines is spatially orthogonal to a plurality of word lines of different word line layers. In this way, each of the bit lines may be shared by a plurality of ferroelectric memory cells of the multiple layers of ferroelectric memory cell array which are correspondingly arranged in the stacking direction of the multiple layers of ferroelectric memory cell array. A word line of the word line layer 503 and a bit line of the bit line array 504 are adjacent to two sides of each ferroelectric memory cell in the x-direction respectively, that is, each ferroelectric memory cell is disposed at the orthogonal position of the word line and bit line, whereby a Crossbar structure in an example of the invention is formed.

Still referring to FIG. 2, compared with the arrangement of the word lines and the ferroelectric memory cells shown in FIG. 1, ferroelectric memory cells are arranged adjacent to the bit line on the two sides of the bit line in the x direction in FIG. 2. In this way, the bit line is coupled to two inline ferroelectric memory cells arranged in the z direction respectively on two sides of the bit line in the x direction and shared by the two inline ferroelectric memory cells. Therefore, compared with the embodiment shown in FIG. 1, bit lines can be reduced and the storage density can be further improved for the ferroelectric memory array structure 50 of the three-dimensional non-volatile ferroelectric memory according to the embodiment shown in FIG. 2.

It is noted that the ferroelectric substrate layer 501 and the plurality of ferroelectric memory cells thereon may be formed by patterning a ferroelectric single crystal layer or a ferroelectric thin film material layer by using a method such as etching. The ferroelectric substrate layer 501 may be used to form the reference ferroelectric bodies (for example, also referred to as "reference cells") of the ferroelectric memory cells, which are adjacent to each of the ferroelectric memory cells, and domain wall conductive passages may be established at their approximate adjacent positions.

The initial polarization direction of the electric domain of each ferroelectric memory cell may be defined to have a component in the x direction. It may also be understood that the initial polarization direction of the electric domain of the memory cell is at an angle to the ferroelectric substrate layer 501 and has a component on the ferroelectric substrate layer 501, but must not be perpendicular to the ferroelectric substrate layer 501 (for example, not in the z direction). In this way, the polarization direction of the electric domain of the ferroelectric memory cell is not perpendicular to the direction of the electric field of the write voltage signal applied to the word lines and bit lines on two sides of the ferroelectric memory cell. As shown in FIG. 2(*c*), the solid-line arrows indicate the initial polarization directions of the electric domains in the ferroelectric memory cells and the ferroelectric substrate layers 501, which may for example be parallel to the x direction. It is understood that the initial polarization directions of the electric domains of each ferroelectric memory cell and its corresponding reference ferroelectric body (for example, ferroelectric substrate layer 501) are not limited to the direction shown in FIG. 2; for example, it may also be a direction which is at an angle but not perpendicular to the x direction, so that there is a component in the x direction.

It is noted that the initial polarization direction of the electric domain of each ferroelectric memory cell having a component in the x direction may also be understood as the initial polarization direction having a projection in the x direction.

As shown in FIG. 2(*a*), the word line layer 503 may include, but be not limited to, three levels, which are sequentially formed on the ferroelectric substrate layer 501. The word lines at each level include a plurality of word lines substantially parallel to each other and extending in the y direction, and are sequentially filled in gaps between adjacent columns of ferroelectric memory cells in the x direction. The word line layer 503 may be vertically aligned in the z direction, that is, the word lines in each of the plurality of levels may be positioned at the same position of each level so that the word lines of different layers are aligned in the z direction (for example, the word lines 503*a*2, 503*b*2 and 503*c*2 are substantially aligned to each other in the z direction).

Still referring to FIG. 2, each ferroelectric memory cell of the memory cell array 502 has a unidirectional conduction characteristic in an ON state, and therefore, the ferroelectric memory cell behaves as having a switch characteristic and has a relatively measurable turn-on voltage $V_{on}$ when a current is read out in the ON state. For the ferroelectric memory cell selected by the word line 503*b*1 and the bit element line 505*b*3 as shown in FIG. 2(*f*), the polarization direction of the electric domain of the ferroelectric memory cell is opposite to the polarization direction of the adjacent reference ferroelectric body below it, and a conductive domain wall is easily formed at their interface, that is, a domain wall conductive passage is established. In a case that the voltage applied to the ferroelectric memory cell is less than the coercive voltage $V_c$ and greater than the turn-on voltage $V_{on}$, if there is a large on-state current flowing through, the stored data may be read out as "1", otherwise, the stored data may be read out as "0".

The principle of the read/write operation of the three-dimensional non-volatile ferroelectric memory according to an embodiment of the present invention is further described with reference to FIG. 2(*d*) to FIG. 2(*f*) below.

As shown in FIG. 2(*d*), it is assumed that a certain ferroelectric memory cell of the ferroelectric memory array structure 50 is selected for the operation of writing data "1". For example, the word line 503*b*1 and the bit element line 505*b*3 are selected. The word line 503*b*1 is configured at a high voltage $V_{write1}$, the value of which is greater than the coercive voltage $V_c$ of the ferroelectric memory cell, and other word lines are floating or configured at a half-height level $V_c/2$; meanwhile, the bit element line 505*b*3 is configured to be grounded, and other bit element lines are floating or configured at a half-height level $V_c/2$. In this way, an electric field having a direction opposite to the initial polarization direction of the ferroelectric memory cell is applied to the selected ferroelectric memory cell, the electric domain of the ferroelectric memory cell is reversed in the positive direction of the x direction, data "1" is written, and the direction indicated by the hollow arrows is the polarization direction of the electric domain after being reversed. After the operation of writing data "1" is completed, the word line 503*b*1 and the bit element line 505*b*3 may be floating or configured at a half-height level $V_c/2$.

As shown in FIG. 2(*e*), it is assumed that a certain ferroelectric memory cell of the ferroelectric memory array structure 50 is still selected for the operation of writing data "0". For example, the word line 503*b*1 and the bit element line 505*b*3 are selected. The word line 503*b*1 is configured to be grounded, other word lines are floating or configured at a half-height level $V_c/2$, and the top bit element line 505*b*3 is configured at a high voltage $V_{write0}$, the value of which is greater than the coercive voltage $V_c$ of the ferroelectric memory cell. In this way, an electric field having a direction which is the same as the initial polarization direction of the ferroelectric memory cell is applied to the selected ferroelectric memory cell, the electric domain of the ferroelectric memory cell is reversed in the negative direction of the x direction, data "0" is written, and the direction indicated by the hollow arrows is the polarization direction of the electric domain after being reversed. After the operation of writing data "0" is completed, the word line 503b1 and the bit element line 505b3 may be floating or configured at a half-height level $V_c/2$.

As shown in FIG. 2(f), it is assumed that a certain ferroelectric memory cell of the ferroelectric memory array structure 50 is still selected for a read operation (for example, a read operation of reading data "1"). For example, the word line 503b1 and the bit element line 505b3 are selected. The word line 503b1 is configured at a voltage $V_{read1}$, the value of which is greater than the turn-on voltage $V_{on}$ and less than the coercive voltage $V_c$ of the ferroelectric memory cell, and other word lines are floating or configured at a half-height level $V_c/2$; meanwhile, the bit element line 505b3 is configured to be grounded, and other bit element lines are floating or configured at a half-height level $V_c/2$. Since there is a domain wall conductive passage (as indicated by the black solid line in FIG. 2(f)) between the selected ferroelectric memory cell and the reference ferroelectric body (for example, the ferroelectric substrate layer 501b), there is a large on-state current (which may for example reach up to $10^{-7}$A to $10^{-6}$A), so that the data stored in the selected ferroelectric memory cell may be read out as "1". After the reading is completed, the word line 503b1 and the bit element line 505b3 may be floating or configured at a half-height level $V_c/2$. Similarly, the data status corresponding to the disappearance of the domain wall may be read out, for example, data "0". At this point, a very small off-state current is read out, that is, the stored data "0" is read out. It is noted that the read voltage $V_{read}$ selected in the process of reading information is adjustable.

Figure 3:
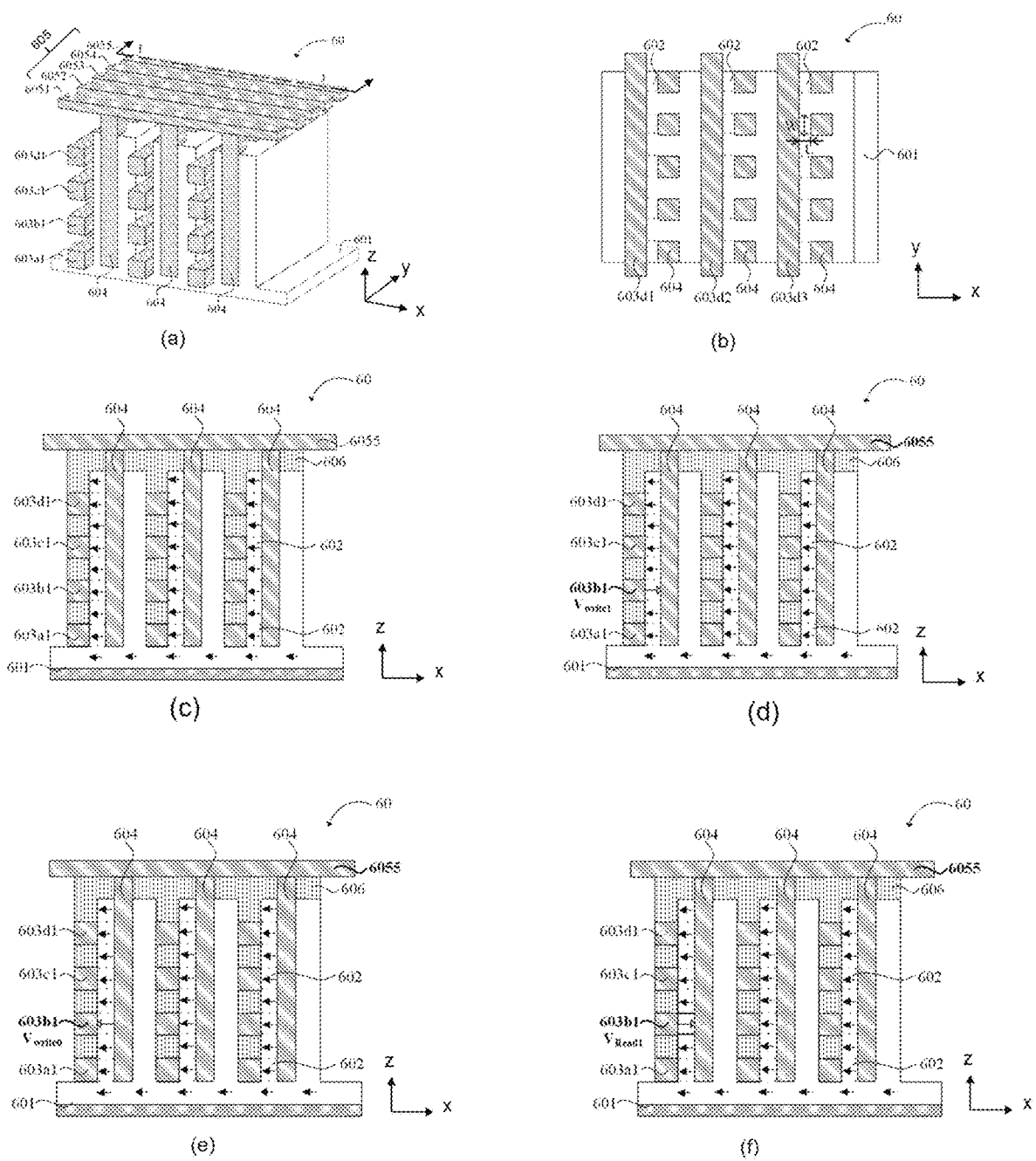
FIG. 3 is a schematic view of a ferroelectric memory array structure of a three-dimensional non-volatile ferroelectric memory according to a third embodiment of the invention and its operational principle.

FIG. 3 is a schematic view of a ferroelectric memory array structure of a three-dimensional non-volatile ferroelectric memory according to a third embodiment of the invention and its operational principle. For clarity and convenience of explanation, FIG. 3(a) illustrates a three-dimensional schematic structural view of a ferroelectric memory array structure 60 according to the embodiment, FIG. 3(b) is a top view of the ferroelectric memory array structure 60 without a top bit element line layer, FIG. 3(c) is a cross-sectional view taken along line I-J in FIG. 3(a), FIG. 3(d) schematically illustrates a principle of an operation of writing data "1" into a ferroelectric memory cell of the ferroelectric memory array structure 60, FIG. 3(e) schematically illustrates a principle of an operation of writing data "0" into a ferroelectric memory cell of the ferroelectric memory array structure 60, and FIG. 3(f) schematically illustrates a principle of an operation of reading data "1" from a ferroelectric memory cell of the ferroelectric memory array structure 60.

As shown in FIG. 3, the ferroelectric memory array structure 60 is included in a three-dimensional non-volatile ferroelectric memory, a corresponding peripheral read/write circuit may be configured for it, and the specific structure of the peripheral read/write circuit is not limited. In order to clearly describe the present invention, a description of the peripheral read/write circuit is omitted herein.

The ferroelectric memory array structure 60 may include a ferroelectric substrate layer 601, multiple layers of memory cell arrays 602, a plurality of word line layers 603 (for example, word line layers 603a, 603b, 603c and 603d stacked sequentially from bottom to top), a bit line array 604, a top bit element line layer 605 and a plurality of insulating layers 606. The uppermost insulating layer 606 may isolate the top bit element line layer 605 from the ferroelectric substrate layer 601 and the like, and the intermediate insulating layer 606 may isolate the adjacent word line layers 603 above and below from each other; other voids may be filled by insulating material.

Still referring to FIG. 3, a ferroelectric substrate layer 601 and multiple layers of memory cell array 602 may be integrally formed by a same ferroelectric single crystal layer or ferroelectric thin film layer, thereby greatly reducing the number of times of deposition of the ferroelectric single crystal layer or ferroelectric thin film layer when forming the multiple layers of ferroelectric memory cell array in a 3D structure, and simplifying the process and reducing the cost. For example, a thicker ferroelectric single crystal layer or ferroelectric thin film layer is formed by using one-time deposition or growth, and the ferroelectric single crystal layer or ferroelectric thin film layer is patterned to form a plurality of deep trenches. The ferroelectric body between the deep trenches may be operated to form a plurality of ferroelectric memory cells of the multiple layers of memory cell array 602, the ferroelectric body between the adjacent ferroelectric memory cells above and below may be used to form a reference ferroelectric body, and the ferroelectric memory cells may be programmed to form a substantially left-right domain wall conductive passage with the reference ferroelectric body. The domain wall conductive passage may be used to electrically connect the word lines and the bit lines on the left and right sides of the domain wall conductive passage.

Specifically, as shown in FIG. 3, a ferroelectric single crystal layer or a ferroelectric thin film layer for forming the ferroelectric substrate layer 601 may be at least patterned to be formed with first deep trenches (or deep holes) and second deep trenches extending in the stacking direction. The bit lines of the bit line array 604 are formed in the first deep trenches, a plurality of word lines (for example, word lines 603a1, 603b1, 603c1 and 603d1) belonging to different word line layers 603 are formed in a same second deep trench, and a dielectric layer for isolating the plurality of word lines is also formed in the second deep trench. In this way, the adjacent upper and lower word lines in the second deep trenches are isolated by the dielectric layer in the second deep trenches, and the dielectric layer may realize some functions of the insulating layer 606.

Thus, although a plurality of ferroelectric memory cells formed in the multiple layers of memory cell array 602 and the corresponding plurality of reference ferroelectric bodies are integrally formed by a same ferroelectric single crystal layer or ferroelectric thin film layer, the ferroelectric memory array structure 60 may also include multiple layers of ferroelectric memory cell array disposed in a stacked way (although there is no substantive physical layered interface between the multiple layers of memory cell arrays 602), which are stacked in the z direction. Each layer of the ferroelectric memory cell array includes a layer of memory cell array 602 disposed at a certain height in the z direction, and a word line layer 603 corresponding to the height. Each word line of the word line layer 603 extends in the y direction, and the plurality of word lines are sequentially arranged in parallel in the x direction. The plurality of ferroelectric memory cells in each layer of the memory cell array 602 are arranged in the row and column direction in the xy plane, and each layer of reference ferroelectric bodies are also arranged in the row and column direction in the xy plane.

Still referring to FIG. 3, the top bit element line layer 605 is disposed at the top, for example, disposed above the word line layer 603d, and the bit line array 604 is disposed to be substantially perpendicular to the plurality of ferroelectric substrate layers 601 and electrically connected to the top bit element line layer 605. A plurality of bit element lines (such as bit element lines 6051, 6052, 6053, 6054, and 6055) of the top bit element line layer 605 may extend in the x direction, and a plurality of bit element lines may be sequentially arranged substantially in parallel in the y direction. The bit lines may be coupled to the read/write circuit external to the ferroelectric memory array structure 60 via the bit lines of the top bit element line layer 605.

Still referring to FIG. 3, each bit line of the bit line array 604 extends downward from a position where it connects with the top bit element line layer 605 and is formed in the first deep trench between the memory cell arrays 602, and each of the bit lines is spatially orthogonal to a plurality of word lines of different word line layers. In this way, each of the bit lines may be shared by a plurality of ferroelectric memory cells of the multiple layers of ferroelectric memory cell array which are correspondingly arranged in the stacking direction of the multiple layers of ferroelectric memory cell array. A word line of the word line layer 603 and a bit line of the bit line array 604 are adjacent to two sides of each ferroelectric memory cell in the x-direction respectively, that is, a ferroelectric memory cell according to an embodiment of the present invention is formed by a corresponding ferroelectric body between the word line and the bit line which are orthogonal (between the first deep trench and the second deep trench). Similarly, each ferroelectric memory cell is disposed at the orthogonal position of the word line and bit line, whereby a Crossbar structure in an example of the invention is formed.

It is noted that the reference ferroelectric body according to an embodiment of the present invention is formed by a corresponding ferroelectric body between a word line and a dielectric layer which are orthogonal, and the reference ferroelectric body is adjacent to the ferroelectric memory cell in the up and down direction. A plurality of reference ferroelectric bodies and a plurality of ferroelectric memory cells alternately arranged in the up and down direction are formed by a same ferroelectric body between the first deep trench and the second deep trench. In this way, a portion of the ferroelectric body adjacent to the dielectric layer in the second deep trench is the reference ferroelectric body, and a portion of the ferroelectric body adjacent to the word line in the second deep trench is the ferroelectric memory cell.

With continued reference to FIG. 3, compared with the arrangement of the word lines and the ferroelectric memory cells shown in FIG. 1, ferroelectric memory cells are arranged adjacent to the bit lines on two sides in the x direction in FIG. 3. In this way, the bit lines are coupled to two inline ferroelectric memory cells correspondingly arranged in the z direction respectively on two sides in the x direction and shared by the two inline ferroelectric memory cells. Therefore, compared with the embodiment shown in FIG. 1, bit lines can be reduced and the storage density can be further improved for the ferroelectric memory array structure 60 of the three-dimensional non-volatile ferroelectric memory according to the embodiment shown in FIG. 3.

Further compared with the arrangement of the word lines and ferroelectric memory cells shown in FIG. 1, the intermediate word lines of the word line array of the word line layer 603 are arranged between two ferroelectric memory cells in FIG. 3. In this way, the word lines are coupled to two columns of ferroelectric memory cells respectively on two sides in the x direction and shared by the two columns of ferroelectric memory cells. Therefore, compared with the embodiment shown in FIG. 1, word lines can be reduced and the storage density can be further improved for the ferroelectric memory array structure 60 of the three-dimensional non-volatile ferroelectric memory according to the embodiment shown in FIG. 3.

Moreover, compared with the ferroelectric memory array structures according to the embodiments shown in FIG. 1 and FIG. 2, the number of ferroelectric substrate layers 601 may be reduced in the ferroelectric memory array structure 60; meanwhile, a thicker ferroelectric single crystal layer or ferroelectric thin film layer may be formed by using one-time deposition or growth. Therefore, on one hand, the ferroelectric memory cells of the ferroelectric memory cell arrays in different layers and the reference ferroelectric bodies have more consistent performances (for example, ferroelectric performance), and better consistency can thus be achieved; on the other hand, defects in the ferroelectric memory cells and reference ferroelectric bodies can be greatly reduced, invalid memory cells can be reduced, and the yield rate of memories can be improved.

It is noted that the initial polarization direction of the electric domain of each ferroelectric memory cell may be defined to have a component in the x direction. It may also be understood that the initial polarization direction of the electric domain of the memory cell is at an angle to the ferroelectric substrate layer 601 and has a component on the ferroelectric substrate layer 601, but must not be perpendicular to the ferroelectric substrate layer 601 (for example, not in the z direction). In this way, the polarization direction of the electric domain of the ferroelectric memory cell is not perpendicular to the direction of the electric field of the write voltage signal applied to the word lines and bit lines on two sides of the ferroelectric memory cell. As shown in FIG. 3(c), the solid-line arrows indicate the initial polarization directions of the electric domains in the ferroelectric memory cells and the ferroelectric substrate layers 601, which may for example be parallel to the x direction. It is understood that the initial polarization directions of the electric domains of each ferroelectric memory cell and its corresponding reference ferroelectric body (for example, ferroelectric substrate layer 601) are not limited to the direction shown in FIG. 3; for example, it may also be a direction which is at an angle but not perpendicular to the x direction, so that there is a component in the x direction.

It is noted that the initial polarization direction of the electric domain of each ferroelectric memory cell having a component in the x direction may also be understood as the initial polarization direction having a projection in the x direction.

Still referring to FIG. 3, each ferroelectric memory cell of the memory cell array 602 has a unidirectional conduction characteristic in an ON state, and therefore, the ferroelectric memory cell behaves as having a switch characteristic and has a relatively measurable turn-on voltage $V_{on}$ when a current is read out in the ON state. For the ferroelectric memory cell selected by the word line 603b1 and the bit element line 6055 as shown in FIG. 3(f), the polarization direction of the electric domain of the ferroelectric memory cell is opposite to the polarization direction of the adjacent reference ferroelectric body below and/or above it, and conductive domain walls (for example, two conductive domain walls) are easily formed at their interface, that is, a domain wall conductive passage is established. In a case that the voltage applied to the ferroelectric memory cell is less than the coercive voltage $V_c$ and greater than the turn-on voltage $V_{on}$, if there is a large on-state current flowing through, the stored data may be read out as "1", otherwise, the stored data may be read out as "0".

The principle of the read/write operation of the three-dimensional non-volatile ferroelectric memory according to an embodiment of the present invention is further described with reference to FIG. 3(d) to FIG. 3(f) below.

As shown in FIG. 3(d), it is assumed that a certain ferroelectric memory cell of the ferroelectric memory array structure 60 is selected for the operation of writing data "1". For example, the word line 603b1 and the bit element line 6055 are selected. The word line 603b1 is configured at a high voltage $V_{write1}$, the value of which is greater than the coercive voltage $V_c$ of the ferroelectric memory cell, and other word lines are floating or configured at a half-height level $V_c/2$; meanwhile, the bit element line 6055 is configured to be grounded, and other bit element lines are floating or configured at a half-height level $V_c/2$. In this way, an electric field having a direction opposite to the initial polarization direction of the ferroelectric memory cell is applied to the selected ferroelectric memory cell, the electric domain of the ferroelectric memory cell is reversed in the positive direction of the x direction, data "1" is written, and the direction indicated by the hollow arrows is the polarization direction of the electric domain after being reversed. After the operation of writing data "1" is completed, the word line 603b1 and the bit element line 6055 may be floating or configured at a half-height level $V_c/2$.

As shown in FIG. 3(e), it is assumed that a certain ferroelectric memory cell of the ferroelectric memory array structure 60 is still selected for the operation of writing data "0". For example, the word line 603b1 and the bit element line 6055 are selected. The word line 603b1 is configured to be grounded, other word lines are floating or configured at a half-height level $V_c/2$, and the top bit element line 6055 is configured at a high voltage $V_{write0}$, the value of which is greater than the coercive voltage $V_c$ of the ferroelectric memory cell. In this way, an electric field having a direction which is the same as the initial polarization direction of the ferroelectric memory cell is applied to the selected ferroelectric memory cell, the electric domain of the ferroelectric memory cell is reversed in the negative direction of the x direction, data "0" is written, and the direction indicated by the hollow arrows is the polarization direction of the electric domain after being reversed. After the operation of writing data "0" is completed, the word line 603b1 and the bit element line 6055 may be floating or configured at a half-height level $V_c/2$.

As shown in FIG. 3(f), it is assumed that a certain ferroelectric memory cell of the ferroelectric memory array structure 60 is still selected for a read operation (for example, a read operation of reading data "1"). For example, the word line 603b1 and the bit element line 6055 are selected. The word line 603b1 is configured at a voltage $V_{read1}$, the value of which is greater than the turn-on voltage $V_{on}$ and less than the coercive voltage $V_c$ of the ferroelectric memory cell, and other word lines are floating or configured at a half-height level $V_c/2$; meanwhile, the bit element line 6055 is configured to be grounded, and other bit element lines are floating or configured at a half-height level $V_c/2$. Since there is a domain wall conductive passage (as indicated by the black solid line in FIG. 3(f)) between the selected ferroelectric memory cell and the reference ferroelectric body (for example, the ferroelectric substrate layer 601b), there is a large on-state current (which may for example reach up to $10^{-7}$A to $10^{-6}$A), so that the data stored in the selected ferroelectric memory cell may be read out as "1". After the reading is completed, the word line 603b1 and the bit element line 6055 may be floating or configured at a half-height level $V_c/2$. Similarly, the data status corresponding to the disappearance of the domain wall may be read out, for example, data "0". At this point, a very small off-state current is read out, that is, the stored data "0" is read out. It is noted that the read voltage $V_{read}$ selected in the process of reading information is adjustable.

Figure 4:
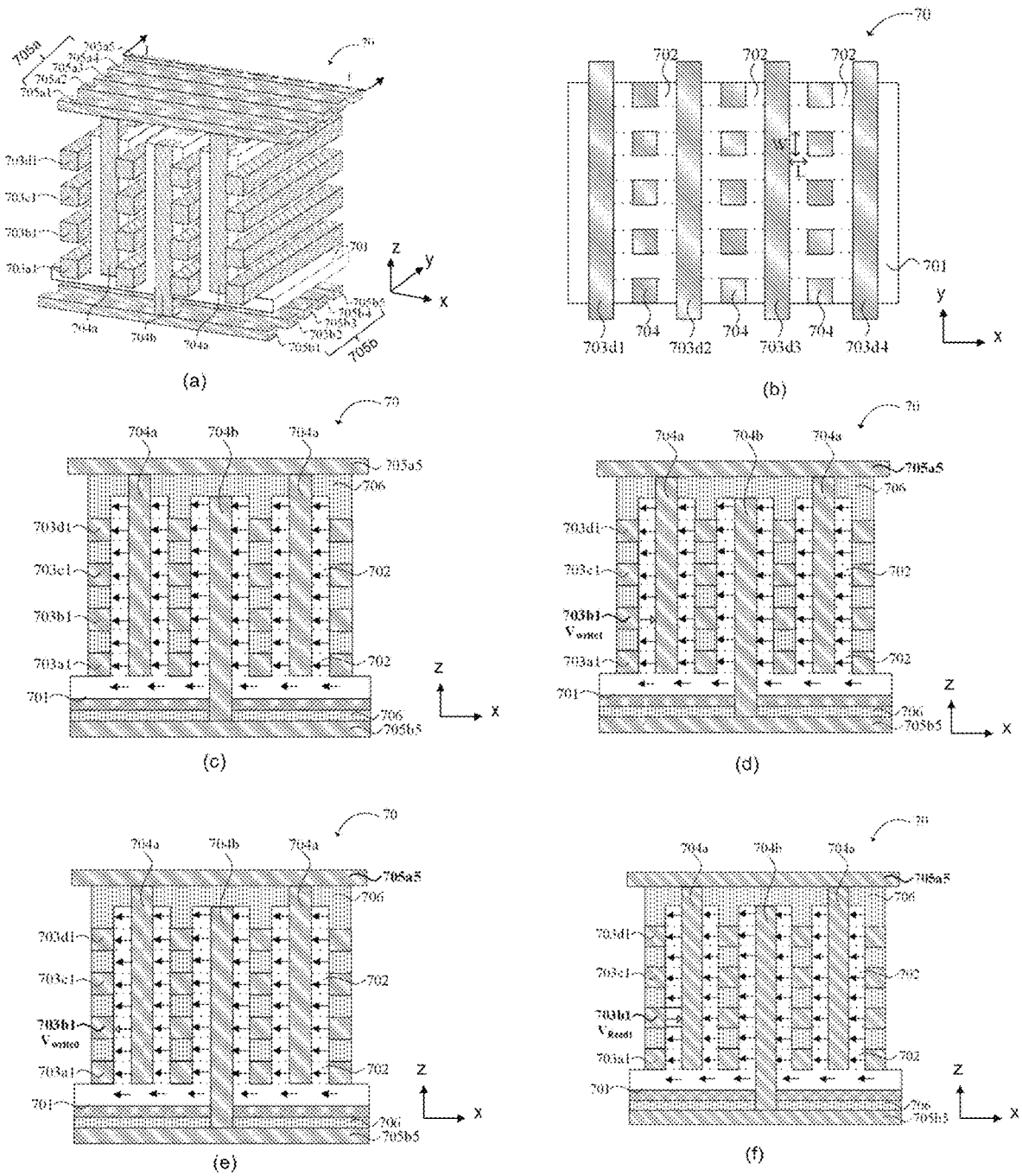
FIG. 4 is a schematic view of a ferroelectric memory array structure of a three-dimensional non-volatile ferroelectric memory according to a fourth embodiment of the invention and its operational principle.

FIG. 4 is a schematic view of a ferroelectric memory array structure of a three-dimensional non-volatile ferroelectric memory according to a fourth embodiment of the invention and its operational principle. For clarity and convenience of explanation, FIG. 4(a) illustrates a three-dimensional schematic structural view of a ferroelectric memory array structure 70 according to the embodiment, FIG. 4(b) is a top view of the ferroelectric memory array structure 70 without a top bit element line layer, FIG. 4(c) is a cross-sectional view taken along line I-J in FIG. 4(a), FIG. 4(d) schematically illustrates a principle of an operation of writing data "1" into a ferroelectric memory cell of the ferroelectric memory array structure 70, FIG. 4(e) schematically illustrates a principle of an operation of writing data "0" into a ferroelectric memory cell of the ferroelectric memory array structure 70, and FIG. 4(f) schematically illustrates a principle of an operation of reading data "1" from a ferroelectric memory cell of the ferroelectric memory array structure 70.

As shown in FIG. 4, the ferroelectric memory array structure 70 is included in a three-dimensional non-volatile ferroelectric memory, a corresponding peripheral read/write circuit may be configured for it, and the specific structure of the peripheral read/write circuit is not limited. In order to clearly describe the present invention, a description of the peripheral read/write circuit is omitted herein.

The ferroelectric memory array structure 70 may include a ferroelectric substrate layer 701, multiple layers of memory cell arrays 702, a plurality of word line layers 703 (for example, word line layers 703a, 703b, 703c and 703d stacked sequentially from bottom to top), bit line arrays 704 (for example, bit line arrays 704a and 704b), a top bit element line layer 705a, a bottom bit element line layer 705b and a plurality of insulating layers 706. The uppermost insulating layer 706 may isolate the top bit element line layer 705a from the ferroelectric substrate layer 701 and the like, and the intermediate insulating layer 706 (for example, a dielectric layer) may isolate the adjacent word line layers 703 above and below from each other; other voids may be filled by insulating material.

Still referring to FIG. 4, a ferroelectric substrate layer 701 and multiple layers of memory cell array 702 may be integrally formed by a same ferroelectric single crystal layer or ferroelectric thin film layer, thereby greatly reducing the number of times of deposition of the ferroelectric single crystal layer or ferroelectric thin film layer when forming the multiple layers of ferroelectric memory cell array in a 3D structure, and simplifying the process and reducing the cost. For example, a thicker ferroelectric single crystal layer or ferroelectric thin film layer is formed by using one-time deposition or growth, and the ferroelectric single crystal layer or ferroelectric thin film layer is patterned to form a plurality of deep trenches. The ferroelectric body between the deep trenches may be operated to form a plurality of ferroelectric memory cells of the multiple layers of memory cell array 702, the ferroelectric body between the adjacent ferroelectric memory cells above and below may be used to form a reference ferroelectric body, and the ferroelectric memory cells may be programmed to form a substantially left-right domain wall conductive passage with the reference ferroelectric body. The domain wall conductive passage may be used to electrically connect the word lines and the bit lines on the left and right sides of the domain wall conductive passage.

Specifically, as shown in FIG. 4, a ferroelectric single crystal layer or a ferroelectric thin film layer for forming the ferroelectric substrate layer 701 may be at least patterned to be formed with first deep trenches (or deep holes) and second deep trenches extending in the stacking direction. The bit lines of the bit line array 704 are formed in the first deep trenches, a plurality of word lines (for example, word lines 703a1, 703b1, 703c1 and 703d1) belonging to different word line layers 703 are formed in a same second deep trench, and a dielectric layer for isolating the plurality of word lines is also formed in the second deep trench. In this way, the adjacent upper and lower word lines in the second deep trenches are isolated by the dielectric layer in the second deep trenches, and the dielectric layer may realize some functions of the insulating layer 706.

Thus, although a plurality of ferroelectric memory cells formed in the multiple layers of memory cell array 702 and the corresponding plurality of reference ferroelectric bodies are integrally formed by a same ferroelectric single crystal layer or ferroelectric thin film layer, the ferroelectric memory array structure 70 may also include multiple layers of ferroelectric memory cell array disposed in a stacked way (although there is no substantive physical layered interface between the multiple layers of memory cell arrays 702), which are stacked in the z direction. Each layer of the ferroelectric memory cell array includes a layer of memory cell array 702 disposed at a certain height in the z direction, and a word line layer 603 corresponding to the height. Each word line of the word line layer 703 extends in the y direction, and the plurality of word lines are sequentially arranged in parallel in the x direction. The plurality of ferroelectric memory cells in each layer of the memory cell array 702 are arranged in the row and column direction in the xy plane, and each layer of reference ferroelectric bodies are also arranged in the row and column direction in the xy plane.

Still referring to FIG. 4, the top bit element line layer 705a is disposed at the top, for example, disposed above the word line layer 703d, and the bit line array 704a is disposed to be substantially perpendicular to the plurality of ferroelectric substrate layers 701 and electrically connected to the top bit element line layer 705a.

The bottom bit element line layer 705b is disposed at the bottom, for example, disposed below the bottom layer of ferroelectric memory cell array (for example, disposed below the ferroelectric substrate layer 701), and the bit line array 704b is disposed to be substantially perpendicular to the plurality of ferroelectric substrate layers 701 and electrically connected to the bottom bit element line layer 705b. The plurality of bit element lines (such as bit element lines 705a1, 705a2, 705a3, 705a4, and 705a5) of the top bit element line layer 705a may extend in the x direction, the plurality of bit element lines (such as bit element lines 705b1, 705b2, 705b3, 705b4, and 705b5) of the top bit element line layer 705b may extend in the x direction, and a plurality of bit lines may be sequentially arranged substantially in parallel in the y direction. The bit lines may be coupled to the read/write circuit external to the ferroelectric memory array structure 70 via the bit element lines of the top bit element line layer 705a or the bottom bit element line layer 705b.

Still referring to FIG. 4, each bit line of the bit line array 704a extends downward from a position where it connects with the top bit element line layer 705a and is formed in the first deep trench between the memory cell arrays 702, and each bit line of the bit line array 704b extends upward from a position where it connects with the bottom bit element line layer 705b and is formed in the first deep trench between the memory cell arrays 702. The bit lines of the bit line array 704a and the bit lines of the bit line array 704b are arranged alternately in the x direction, and each of the bit lines is spatially orthogonal to a plurality of word lines of different word line layers. In this way, each of the bit lines may be shared by a plurality of ferroelectric memory cells of the multiple layers of ferroelectric memory cell array which are correspondingly arranged in the stacking direction of the multiple layers of ferroelectric memory cell array. A word line of the word line layer 703 and a bit line of the bit line array 704 are adjacent to two sides of each ferroelectric memory cell in the x-direction respectively, that is, a ferroelectric memory cell according to an embodiment of the present invention is formed by a corresponding ferroelectric body between the word line and the bit line which are orthogonal (between the first deep trench and the second deep trench). Similarly, each ferroelectric memory cell is disposed at the orthogonal position of the word line and bit line, whereby a Crossbar structure in an example of the invention is formed.

It is noted that the reference ferroelectric body according to an embodiment of the present invention is formed by a corresponding ferroelectric body between a word line and a dielectric layer which are orthogonal, and the reference ferroelectric body is adjacent to the ferroelectric memory cell in the up and down direction. A plurality of reference ferroelectric bodies and a plurality of ferroelectric memory cells alternately arranged in the up and down direction are formed by a same ferroelectric body between the first deep trench and the second deep trench. In this way, a portion of the ferroelectric body adjacent to the dielectric layer in the second deep trench is the reference ferroelectric body, and a portion of the ferroelectric body adjacent to the word line in the second deep trench is the ferroelectric memory cell.

With continued reference to FIG. 4, similar to the ferroelectric memory array structure shown in FIG. 3, the bit lines are coupled to two inline ferroelectric memory cells correspondingly arranged in the z direction respectively on two sides in the x direction and shared by the two inline ferroelectric memory cells, and the word lines are coupled to two columns of ferroelectric memory cells respectively on two sides in the x direction and shared by the two columns of ferroelectric memory cells. Therefore, compared with the embodiment shown in FIG. 1, word lines and bit lines can be reduced and the storage density can be further improved for the ferroelectric memory array structure 70 of the three-dimensional non-volatile ferroelectric memory according to the embodiment shown in FIG. 4.

Moreover, compared with the ferroelectric memory array structures according to the embodiments shown in FIG. 1 and FIG. 2, the number of ferroelectric substrate layers 701 may be reduced in the ferroelectric memory array structure 70; meanwhile, a thicker ferroelectric single crystal layer or ferroelectric thin film layer may be formed by using one-time deposition or growth. Therefore, on one hand, the ferroelectric memory cells of the ferroelectric memory cell arrays in different layers and the reference ferroelectric bodies have more consistent performances (for example, ferroelectric performance), and better consistency can thus be achieved; on the other hand, defects in the ferroelectric memory cells and reference ferroelectric bodies can be greatly reduced, invalid memory cells can be reduced, and the yield rate of memories can be improved.

It is noted that the initial polarization direction of the electric domain of each ferroelectric memory cell may be defined to have a component in the x direction. It may also be understood that the initial polarization direction of the electric domain of the memory cell is at an angle to the ferroelectric substrate layer 701 and has a component on the ferroelectric substrate layer 701, but must not be perpendicular to the ferroelectric substrate layer 701 (for example, not in the z direction). In this way, the polarization direction of the electric domain of the ferroelectric memory cell is not perpendicular to the direction of the electric field of the write voltage signal applied to the word lines and bit lines on two sides of the ferroelectric memory cell. As shown in FIG. 4(c), the solid-line arrows indicate the initial polarization directions of the electric domains in the ferroelectric memory cells and the ferroelectric substrate layers 701, which may for example be parallel to the x direction. It is understood that the initial polarization directions of the electric domains of each ferroelectric memory cell and its corresponding reference ferroelectric body (for example, ferroelectric substrate layer 701) are not limited to the direction shown in FIG. 4; for example, it may also be a direction which is at an angle but not perpendicular to the x direction, so that there is a component in the x direction.

It is noted that the initial polarization direction of the electric domain of each ferroelectric memory cell having a component in the x direction may also be understood as the initial polarization direction having a projection in the x direction.

Still referring to FIG. 4, each ferroelectric memory cell of the memory cell array 702 has a unidirectional conduction characteristic in an ON state, and therefore, the ferroelectric memory cell behaves as having a switch characteristic and has a relatively measurable turn-on voltage $V_{on}$ when a current is read out in the ON state. For the ferroelectric memory cell selected by the word line 703b1 and the bit element line 705a5 as shown in FIG. 4(f), the polarization direction of the electric domain of the ferroelectric memory cell is opposite to the polarization direction of the adjacent reference ferroelectric body below and/or above it, and conductive domain walls (for example, two conductive domain walls) are easily formed at their interface, that is, a domain wall conductive passage is established. In a case that the voltage applied to the ferroelectric memory cell is less than the coercive voltage $V_c$ and greater than the turn-on voltage $V_{on}$, if there is a large on-state current flowing through, the stored data may be read out as "1", otherwise, the stored data may be read out as "0".

The principle of the read/write operation of the three-dimensional non-volatile ferroelectric memory according to an embodiment of the present invention is further described with reference to FIG. 4(d) to FIG. 4(f) below.

As shown in FIG. 4(d), it is assumed that a certain ferroelectric memory cell of the ferroelectric memory array structure 70 is selected for the operation of writing data "1". For example, the word line 703b1 and the bit element line 705a5 are selected. The word line 703b1 is configured at a high voltage $V_{write1}$, the value of which is greater than the coercive voltage $V_c$ of the ferroelectric memory cell, and other word lines are floating or configured at a half-height level $V_c/2$; meanwhile, the bit element line 705a5 is configured to be grounded, and other bit element lines are floating or configured at a half-height level $V_c/2$. In this way, an electric field having a direction opposite to the initial polarization direction of the ferroelectric memory cell is applied to the selected ferroelectric memory cell, the electric domain of the ferroelectric memory cell is reversed in the positive direction of the x direction, data "1" is written, and the direction indicated by the hollow arrows is the polarization direction of the electric domain after being reversed. After the operation of writing data "1" is completed, the word line 703b1 and the bit element line 705a5 may be floating or configured at a half-height level $V_c/2$.

As shown in FIG. 4(e), it is assumed that a certain ferroelectric memory cell of the ferroelectric memory array structure 70 is still selected for the operation of writing data "0". For example, the word line 703b1 and the bit element line 705a5 are selected. The word line 703b1 is configured to be grounded, other word lines are floating or configured at a half-height level $V_c/2$, and the top bit element line 705a5 is configured at a high voltage $V_{write0}$, the value of which is greater than the coercive voltage $V_c$ of the ferroelectric memory cell. In this way, an electric field having a direction which is the same as the initial polarization direction of the ferroelectric memory cell is applied to the selected ferroelectric memory cell, the electric domain of the ferroelectric memory cell is reversed in the negative direction of the x direction, data "0" is written, and the direction indicated by the hollow arrows is the polarization direction of the electric domain after being reversed. After the operation of writing data "0" is completed, the word line 703b1 and the bit element line 705a5 may be floating or configured at a half-height level $V_c/2$.

As shown in FIG. 4(f), it is assumed that a certain ferroelectric memory cell of the ferroelectric memory array structure 70 is still selected for a read operation (for example, a read operation of reading data "1"). For example, the word line 703b1 and the bit element line 705a5 are selected. The word line 703b1 is configured at a voltage $V_{read1}$, the value of which is greater than the turn-on voltage $V_{on}$ and less than the coercive voltage $V_c$ of the ferroelectric memory cell, and other word lines are floating or configured at a half-height level $V_c/2$; meanwhile, the bit element line 705a5 is configured to be grounded, and other bit element lines are floating or configured at a half-height level $V_c/2$. Since there is a domain wall conductive passage (as indicated by the black solid line in FIG. 4(f)) between the selected ferroelectric memory cell and the reference ferroelectric body (for example, the ferroelectric substrate layer 701b), there is a large on-state current (which may for example reach up to $10^{-7}$A to $10^{-6}$A), so that the data stored in the selected ferroelectric memory cell may be read out as "1". After the reading is completed, the word line 703b1 and the bit element line 705a5 may be floating or configured at a half-height level $V_c/2$. Similarly, the data status corresponding to the disappearance of the domain wall may be read out, for example, data "0". At this point, a very small off-state current is read out, that is, the stored data "0" is read out.

Figure 5:
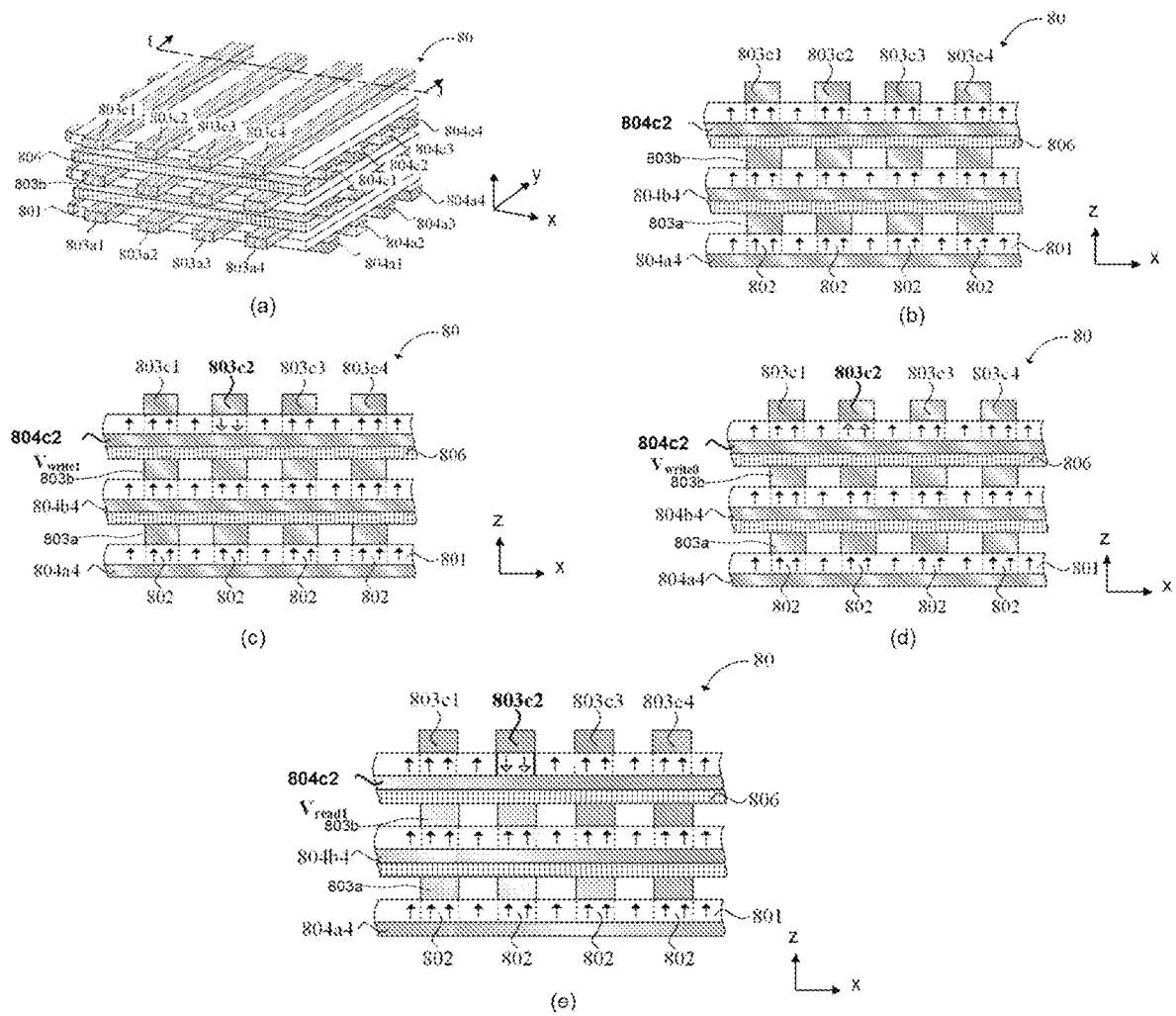
FIG. 5 is a schematic view of a ferroelectric memory array structure of a three-dimensional non-volatile ferroelectric memory according to a fifth embodiment of the invention and its operational principle.

FIG. 5 is a schematic view of a ferroelectric memory array structure of a three-dimensional non-volatile ferroelectric memory according to a fifth embodiment of the invention and its operational principle. For clarity and convenience of explanation, FIG. 5(a) illustrates a three-dimensional schematic structural view of a ferroelectric memory array structure 80 according to the embodiment, FIG. 5(b) is a cross-sectional view taken along line I-J in FIG. 5(a), FIG. 5(c) schematically illustrates a principle of an operation of writing data "1" into a ferroelectric memory cell of the ferroelectric memory array structure 80, FIG. 5(d) schematically illustrates a principle of an operation of writing data "0" into a ferroelectric memory cell of the ferroelectric memory array structure 80, and FIG. 5(e) schematically illustrates a principle of an operation of reading data "1" from a ferroelectric memory cell of the ferroelectric memory array structure 80.

As shown in FIG. 5, the ferroelectric memory array structure 80 is included in a three-dimensional non-volatile ferroelectric memory, a corresponding peripheral read/write circuit may be configured for it, and the specific structure of the peripheral read/write circuit is not limited. In order to clearly describe the present invention, a description of the peripheral read/write circuit is omitted herein.

The ferroelectric memory array structure 80 may include a plurality of ferroelectric thin film layers 801 (for example, ferroelectric thin film layers 801a, 801b, and 801c stacked sequentially from bottom to top), multiple layers of memory cell arrays 802 correspondingly formed in the plurality of ferroelectric thin film layers 801 respectively, a plurality of word line layers 803 (for example, word line layers 803a, 803b, and 803c stacked sequentially from bottom to top), a plurality of bit line layers 804 (for example, bit line layers 804a, 804b, and 804c stacked sequentially from bottom to top) and a plurality of insulating layers 806.

In this way, the ferroelectric memory array structure 80 includes multiple layers of ferroelectric memory cell array disposed in a stacked way, which are sequentially stacked in the z direction, that is, the stacking direction is the z direction. Each layer of the ferroelectric memory cell arrays includes a bit line layer 804, a ferroelectric thin film layer 801, a word line layer 803, and an insulating layer 806.

Each word line of the word line layer 803 extends in the y direction, and a plurality of word lines are sequentially arranged in parallel in the x direction. For example, the word lines 803a1, 803a2, 803a3 and 803a4 of the word line layer 803a are arranged in parallel, and the word lines 803c1, 803c2, 803c3 and 803c4 of the word line layer 803c are arranged in parallel. Each bit line of the bit line layer 804 extends in the x direction, and a plurality of bit lines are sequentially arranged in parallel in the y direction. For example, the bit lines 804a1, 804a2, 804a3 and 804a4 of the bit line layer 804a are arranged in parallel, and the bit lines 804c1, 804c2, 804c3 and 804c4 of the bit line layer 804c are arranged in parallel. In this way, the bit lines and the word lines are spatially orthogonal to each other in each layer of the ferroelectric memory cell array, the ferroelectric memory cells of the memory cell array 802 are formed in the ferroelectric thin film layer 801 at the orthogonal positions of the word lines and bit lines, and the ferroelectric memory cells may be arranged in rows and columns in the ferroelectric thin film layer 801. A Crossbar structure in an example of the invention is formed by word lines, ferroelectric memory cells and bit lines. The plurality of ferroelectric memory cells of each layer of the memory cell array 802 are arranged in the row and column directions, for example, the ferroelectric memory cells are arranged in lattices in the x-direction and the y-direction, and each ferroelectric thin film layer 801 is arranged in the xy plane.

It is noted that a portion of the ferroelectric thin film layer 801 except for the ferroelectric memory cells may be used as the reference ferroelectric bodies (for example, also referred to as "reference cells"), which are adjacent to each of the ferroelectric memory cells, and a domain wall conductive passage may be established at their approximate adjacent positions.

The initial polarization direction of the electric domain of each ferroelectric memory cell may be defined to have a component in the x direction. It may also be understood that the initial polarization direction of the electric domain of the memory cell is at an angle to the ferroelectric thin film layer 801 and has a component on the ferroelectric thin film layer 801, but must not be perpendicular to the ferroelectric thin film layer 801 (for example, not in the z direction). In this way, the polarization direction of the electric domain of the ferroelectric memory cell is not perpendicular to the direction of the electric field of the write voltage signal applied to the word lines and bit lines on two sides of the ferroelectric memory cell. As shown in FIG. 5(b), the solid-line arrows indicate the initial polarization directions of the electric domains in the ferroelectric memory cells and the ferroelectric thin film layers 801, which may for example be parallel to the z direction. It is understood that the initial polarization directions of the electric domains of each ferroelectric memory cell and its corresponding reference ferroelectric body (for example, ferroelectric thin film layer 801) are not limited to the direction shown in FIG. 5; for example, it may also be a direction which is at an angle but not perpendicular to the z direction, so that there is a component in the z direction.

As shown in FIG. 5(a), the ferroelectric thin film layer 801, the word line layer 803 and the bit line layer 804 may include, but be not limited to, three levels. The word line layer 803 may be vertically aligned in the z direction, that is, the word lines in each of the plurality of levels may be positioned at the same position of each level so that the word lines of different layers are aligned in the z direction. The bit line layer 804 may be vertically aligned in the z direction, that is, the bit lines in each of the plurality of levels may be positioned at the same position of each level so that the bit lines of different layers are aligned in the z direction.

Still referring to FIG. 5, each ferroelectric memory cell of the memory cell array 802 has a unidirectional conduction characteristic in an ON state, and therefore, the ferroelectric memory cell behaves as having a switch characteristic and has a relatively measurable turn-on voltage $V_{on}$ when a current is read out in the ON state. For the ferroelectric memory cell selected by the word line 803b1 and the bit element line 804c4 as shown in FIG. 5(e), the polarization direction of the electric domain of the ferroelectric memory cell is opposite to the polarization direction of the adjacent reference ferroelectric body below it, and a conductive domain wall is easily formed at their interface, that is, a domain wall conductive passage is established. In a case that the voltage applied to the ferroelectric memory cell is less than the coercive voltage $V_c$ and greater than the turn-on voltage $V_{on}$, if there is a large on-state current flowing through, the stored data may be read out as "1", otherwise, the stored data may be read out as "0".

The principle of the read/write operation of the three-dimensional non-volatile ferroelectric memory according to an embodiment of the present invention is further described with reference to FIG. 5(c) to FIG. 5(e) below.

As shown in FIG. 5(c), it is assumed that a certain ferroelectric memory cell of the ferroelectric memory array structure 80 is selected for the operation of writing data "1". For example, the word line 803b1 and the bit element line 804c4 are selected. The word line 803b1 is configured at a high voltage $V_{write1}$, the value of which is greater than the coercive voltage $V_c$ of the ferroelectric memory cell, and other word lines are floating or configured at a half-height level $V_c/2$; meanwhile, the bit element line 804c4 is configured to be grounded, and other bit element lines are floating or configured at a half-height level $V_c/2$. In this way, an electric field having a direction opposite to the initial polarization direction of the ferroelectric memory cell is applied to the selected ferroelectric memory cell, the electric domain of the ferroelectric memory cell is reversed in the positive direction of the x direction, data "1" is written, and the direction indicated by the hollow arrows is the polarization direction of the electric domain after being reversed. After the operation of writing data "1" is completed, the word line 803b1 and the bit element line 804c4 may be floating or configured at a half-height level $V_c/2$.

As shown in FIG. 5(d), it is assumed that a certain ferroelectric memory cell of the ferroelectric memory array structure 80 is still selected for the operation of writing data "0". For example, the word line 803b1 and the bit element line 804c4 are selected. The word line 803b1 is configured to be grounded, other word lines are floating or configured at a half-height level $V_c/2$, and the top bit element line 804c4 is configured at a high voltage $V_{write0}$, the value of which is greater than the coercive voltage $V_c$ of the ferroelectric memory cell. In this way, an electric field having a direction which is the same as the initial polarization direction of the ferroelectric memory cell is applied to the selected ferroelectric memory cell, the electric domain of the ferroelectric memory cell is reversed in the negative direction of the x direction, data "0" is written, and the direction indicated by the hollow arrows is the polarization direction of the electric domain after being reversed. After the operation of writing data "0" is completed, the word line 803b1 and the bit element line 804c4 may be floating or configured at a half-height level $V_c/2$.

As shown in FIG. 5(e), it is assumed that a certain ferroelectric memory cell of the ferroelectric memory array structure 80 is still selected for a read operation (for example, a read operation of reading data "1"). For example, the word line 803b1 and the bit element line 804c4 are selected. The word line 803b1 is configured at a voltage $V_{read1}$, the value of which is greater than the turn-on voltage $V_{on}$ and less than the coercive voltage $V_c$ of the ferroelectric memory cell, and other word lines are floating or configured at a half-height level $V_c/2$; meanwhile, the bit element line 804c4 is configured to be grounded, and other bit element lines are floating or configured at a half-height level $V_c/2$. Since there is a domain wall conductive passage (as indicated by the black solid line in FIG. 5(e)) between the selected ferroelectric memory cell and the reference ferroelectric body (for example, the ferroelectric thin film layer 801b), there is a large on-state current (which may for example reach up to $10^{-7}$A to $10^{-6}$A), so that the data stored in the selected ferroelectric memory cell may be read out as "1". After the reading is completed, the word line 803b1 and the bit element line 804c4 may be floating or configured at a half-height level $V_c/2$. Similarly, the data status corresponding to the disappearance of the domain wall may be read out, for example, data "0". At this point, a very small off-state current is read out, that is, the stored data "0" is read out.

It can be seen that, based on the unidirectional conduction characteristic of the ferroelectric memory cell of the 3D non-volatile ferroelectric memory according to the above embodiments of the present invention, the crosstalk generated to the memory cells adjacent to the selected ferroelectric memory cell is greatly reduced especially during the read operation, and the leakage power consumption is less. Therefore, a selecting transistor or a switch transistor can be completely omitted for the ferroelectric memory cell, the Crossbar structure becomes simpler, and the cost is lower.

It should be noted that in the ferroelectric memory array structures 40-80 with the Crossbar structure according to the above embodiments, the three-dimensional stacking of multiple layers of ferroelectric memory cell array can be completely realized, thus greatly improving the storage density and significantly reducing the manufacture cost per unit storage capacity.

It is understood that although three or four layers of ferroelectric memory cell array are used as an example for illustration in the above FIGS. 1 to 5, the number of layers of the ferroelectric memory cell arrays stacked in the ferroelectric memory array structure 40 is not limited. Those skilled in the art can select the number of layers of the ferroelectric memory cell arrays based on the requirements such as storage density and the like. Of course, two or more ferroelectric memory array structures 40 may be stacked in the z direction to improve the storage density.

For the 3D non-volatile ferroelectric memory according to the above embodiments shown in FIG. 1 to FIG. 5, a ferroelectric material used for the ferroelectric single crystal layer or the ferroelectric thin film layer of the ferroelectric memory cell and/or the reference ferroelectric body is selected from one or more of the followings:

lithium tantalate $LiTaO_3$, lithium niobate $LiNbO_3$ or Bismuth ferrite $BiFeO_3$;

lithium tantalate $LiTaO_3$, lithium niobate $LiNbO_3$ or Bismuth ferrite $BiFeO_3$ doped with a material selected from MgO, $Mn_2O_5$, $Fe_2O_3$ or $La_2O_3$;

lead zirconate titanate (Pb, Zr) $TiO_3$ or $BaTiO_3$; and blackened lithium tantalate $LiTaO_3$ or blackened lithium niobate $LiNbO_3$.

In a specific embodiment of the invention, a single ferroelectric memory cell having a size of 200×200 $nm^2$ is successfully prepared on an X-cut surface of a 5% Mg-doped lithium niobate ($LiNbO_3$) single crystal. FIG. 9a shows atomic force morphology of the memory cell having a size of 200×200 $nm^2$, in which the left and right electrodes (L and R) are connected at two ends of the device. FIG. 9b shows the in-plane piezoelectric imaging, in which the ferroelectric domain can be reversed to the right or left by applying a write voltage (+/−10V) greater than the coercive voltage ($V_c$) across the L and R electrodes (see the black or white imaging area in the figure), and data information of the logics "1" and "0" is therefore stored non-volatilely.

Figure 6:
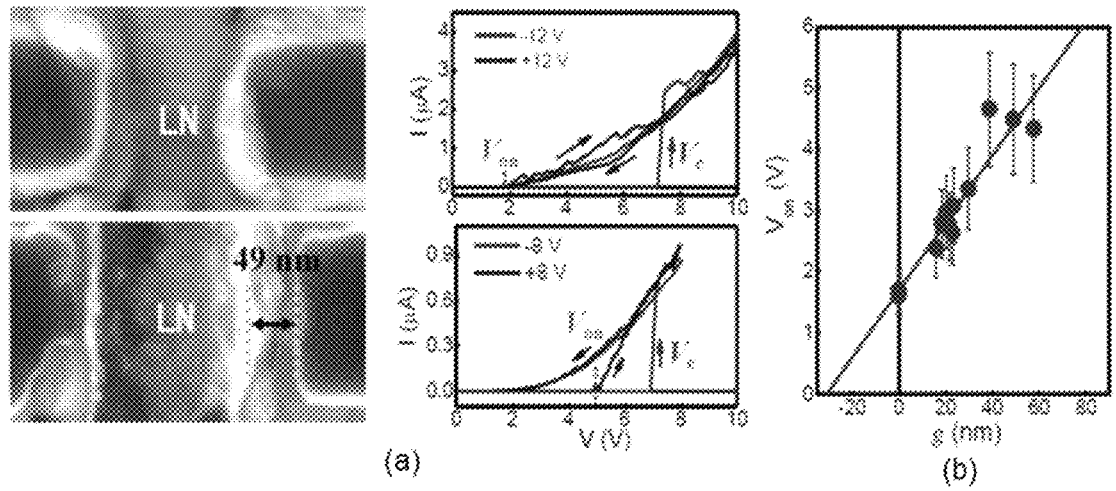
FIG. 6(a) shows a single ferroelectric memory cell formed on a surface of a single crystal lithium niobate ($LiNbO_3$) and an I-V characteristic graph of a read/write operation thereof by way of voltage-sweeping according to an embodiment of the invention.
FIG. 6(b) is a schematic view showing a variation of a turn-on voltage $V_{on}$ of the ferroelectric memory cell with a gap g between a right electrode and the ferroelectric memory cell according to an embodiment of the invention.

It is specially noted that the on-state current of each ferroelectric memory cell naturally has a diode current unidirectional conduction characteristic, and the read voltage of the on-state current in each cell is required to be larger than a $V_{on}$ with an adjustable magnitude. The turn-on voltage read out by the current may be adjusted by changing the contact pitch (0-100 nm) between the electrodes and the ferroelectric memory cell. The left side of FIG. 6(a) shows a morphology of a scanning electron microscope of the other two ferroelectric memory cells prepared on the surface of the $LiNbO_3$ single crystal, and the gap (g) between the right electrode and the ferroelectric memory cell is 0 nm (the upper left graph in FIG. 6 (a)) and 49 nm (the lower left graph in FIG. 6(a)) respectively. The right graph of FIG. 6(a) shows current-voltage (I-V) curves for the above two devices measured after writing "1" (black curve) and "0" (grey curve) information under a voltage of +/−12V, respectively. After the "1" information is written, the write domain is anti-parallel to the block domain that is constant at the bottom in the ferroelectric memory cell, between which a conductive domain wall is formed. As the measurement voltage in the I-V curve increases from 0V, the current starts at 0, but when the voltage is greater than a certain turn-on voltage $V_{on}$, the current abruptly increases, and $V_{on}$ varies with the gap g between the right electrode and the ferroelectric memory cell: if g=0 nm, then $V_{on}$=1.8V; and if g=49 nm, then $V_{on}$=5V. The above research results show that the turn-on voltage $V_{on}$ is adjustable, and the measurement result of FIG. 6(b) proves that the $V_{on}$ varies linearly with the gap g. The adjustable $V_{on}$ facilitates the selection of the read voltage in the Crossbar array.

In another specific embodiment of the present invention, an LN single crystal thin film with a thickness of 300nm is prepared by ion bonding at a low temperature on a silicon single crystal substrate, and then ferroelectric memory cells having a size of 200×200 nm² are prepared on the surface of the thin film.

Figure 7:
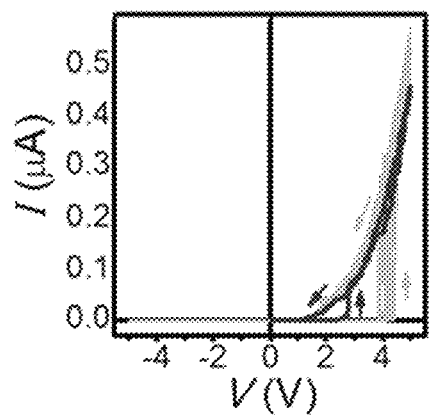
FIG. 7 is an I-V characteristic graph of a read/write operation, by way of voltage-sweeping, of a single ferroelectric memory cell formed on a surface of a lithium niobate ($LiNbO_3$) single crystal thin film according to an embodiment of the invention.

As shown in FIG. 7, after writing "1" (black curve) and "0" (grey curve) information under a voltage of +/−5V, the read currents of the device are in an on state and an off state, respectively. The measurement results of the current-voltage curve show that the turn-on voltage is 2.7V and the coercive voltage $V_c$ is about 4V.

In the above description, directional terms and similar terms that are used to describe the components in various embodiments represent the directions shown in the drawings or directions that can be understood by those skilled in the art. These directional terms are used for a relative description and clarification, instead of limiting the orientation in any embodiment to a specific direction or orientation. For example, in other alternative embodiments, the direction corresponding to the above "column" may be changed to the direction corresponding to "row", and the direction corresponding to the "row" may also be changed to the direction corresponding to "column".

In the above embodiments, the low-power consumption 3D non-volatile ferroelectric memory of the invention is mainly described. While only some of the embodiments of the invention are described, those skilled in the art will understand that the invention can be carried out in many other forms without departing from the spirit and scope thereof. Therefore, the disclosed examples and embodiments should be considered as illustrative rather than limiting. The invention can cover many variations and replacements without departing from the spirit and scope of the invention defined by the appended claims.

What is claimed is:

1. A three-dimensional non-volatile ferroelectric memory, comprising a ferroelectric memory array structure, wherein the ferroelectric memory array structure comprises multiple layers of ferroelectric memory cell array disposed in a stacked way, and each layer of the ferroelectric memory cell array comprises ferroelectric memory cells arranged in rows and columns;
  wherein word lines and bit lines which are substantially orthogonal to each other are oppositely disposed on two sides of the corresponding ferroelectric memory cell respectively, and a reference ferroelectric body is disposed adjacent to the corresponding ferroelectric memory cell; and
  a polarization direction of an electric domain in the ferroelectric memory cell is not perpendicular to an electric field direction of a write voltage signal applied to the word line and the bit line; and when the write voltage signal is applied between the word line and the bit line, the electric domain in the ferroelectric memory cell can be reversed and a domain wall conductive passage can be established between the ferroelectric memory cell and the reference ferroelectric body adjacent thereto, wherein the word line and bit line on the two sides of the ferroelectric memory cell can be electrically connected by the domain wall conductive passage.

2. The three-dimensional non-volatile ferroelectric memory according to claim 1, wherein the ferroelectric memory cell and the reference ferroelectric body are integrally formed by a same ferroelectric single crystal layer or ferroelectric thin film layer.

3. The three-dimensional non-volatile ferroelectric memory according to claim 2, wherein a ferroelectric material used for the ferroelectric single crystal layer or the ferroelectric thin film layer is selected from one or more of the followings:
  lithium tantalate $LiTaO_3$, lithium niobate $LiNbO_3$ or Bismuth ferrite $BiFeO_3$;
  lithium tantalate $LiTaO_3$, lithium niobate $LiNbO_3$ or Bismuth ferrite $BiFeO_3$ doped with a material selected from $MgO$, $Mn_2O_5$, $Fe_2O_3$ or $La_2O_3$;
  lead zirconate titanate $(Pb, Zr) TiO_3$ or $BaTiO_3$; and
  blackened lithium tantalate $LiTaO_3$ or blackened lithium niobate $LiNbO_3$.

4. The three-dimensional non-volatile ferroelectric memory according to claim 1, wherein each of the bit lines is shared by a plurality of ferroelectric memory cells of the multiple layers of ferroelectric memory cell array, which are correspondingly arranged in the stacking direction of the multiple layers of ferroelectric memory cell array; and each bit line of each layer of the ferroelectric memory cell array is shared by a plurality of ferroelectric memory cells of the ferroelectric memory cell array, which are correspondingly arranged in a column/row direction.

5. The three-dimensional non-volatile ferroelectric memory according to claim 4, further comprising:
  a bit element line layer disposed on a top layer and/or a bottom layer of the multiple layers of ferroelectric memory cell array, wherein each bit element line of the bit element line layer is electrically connected to a plurality of the bit lines arranged sequentially in the row/column direction.

6. The three-dimensional non-volatile ferroelectric memory according to claim 4, wherein the word line is coupled to two columns/rows of the ferroelectric memory cells respectively on two sides in the row/column direction, and is shared by the two columns/rows of the ferroelectric memory cells; and/or
  the bit line is coupled to two inline ferroelectric memory cells correspondingly arranged in the stacking direction on two sides in the row/column direction and is shared by the two inline ferroelectric memory cells.

7. The three-dimensional non-volatile ferroelectric memory according to claim 4, wherein the ferroelectric memory cell of the multiple layers of ferroelectric memory cell array and the corresponding reference ferroelectric body are integrally formed by a same ferroelectric single crystal layer or ferroelectric thin film layer.

8. The three-dimensional non-volatile ferroelectric memory according to claim 7, wherein the ferroelectric single crystal layer or the ferroelectric thin film layer is patterned to have first deep trenches and second deep trenches both extending in the stacking direction, wherein the bit lines are formed in the first deep trenches, a plurality of the word lines are formed in a same second deep trench, and the corresponding word lines are isolated via dielectric layers in the second deep trenches; and
  wherein the ferroelectric memory cell of the multiple layers of ferroelectric memory cell array and the corresponding reference ferroelectric body are formed in a ferroelectric body between the first deep trench and the second deep trench, a portion of the ferroelectric body adjacent to the dielectric layer in the second deep trench is the reference ferroelectric body, and a portion of the ferroelectric body adjacent to the word line in the second deep trench is the ferroelectric memory cell.

9. The three-dimensional non-volatile ferroelectric memory according to claim 7, wherein a plurality of the word lines and a plurality of dielectric layers in the same second deep trench are arranged alternately in the stacking direction, and a plurality of the reference ferroelectric bodies and a plurality of the ferroelectric memory cells are arranged alternately in the stacking direction.

10. The three-dimensional non-volatile ferroelectric memory according to claim 4, wherein each layer of the ferroelectric memory cell array comprises:
a ferroelectric substrate layer as the reference ferroelectric body;
a plurality of ferroelectric memory cells arranged in rows and columns and protruded with respect to the ferroelectric substrate layer; and
a word line layer comprising a plurality of word lines, which is disposed on the ferroelectric substrate layer;
wherein the bit lines extend through the ferroelectric substrate layers of the multiple layers of ferroelectric memory cell array in the stacking direction.

11. The three-dimensional non-volatile ferroelectric memory according to claim 1, wherein each layer of the ferroelectric memory cell array comprises:
a bit line layer/word line layer for forming a plurality of bit lines/word lines;
a ferroelectric body layer on the bit line layer; and
a word line layer/bit line layer for forming a plurality of word lines/bit lines and located on the ferroelectric body layer;
wherein a ferroelectric body layer corresponding to an intersection of the word line and the bit line is configured to form the ferroelectric memory cell, and the remaining portion of the ferroelectric body layer is configured to form the reference ferroelectric body.

12. The three-dimensional non-volatile ferroelectric memory according to claim 1, wherein each of the ferroelectric memory cells has a unidirectional conduction characteristic in an ON state.

13. The three-dimensional non-volatile ferroelectric memory according to claim 12, wherein the three-dimensional non-volatile ferroelectric memory has a read voltage greater than a turn-on voltage for causing the ferroelectric memory cell to conduct unidirectionally and less than a coercive voltage of the ferroelectric memory cell.

14. The three-dimensional non-volatile ferroelectric memory according to claim 1, wherein there is an included angle between the polarization direction of the electric domain of the ferroelectric memory cell and a direction of a connecting line between the word line and the bit line on two sides of the ferroelectric memory cell, and the electric domain has a component in the direction of the connecting line.

* * * * *